(12) United States Patent
Lee et al.

(10) Patent No.: US 7,164,371 B2
(45) Date of Patent: Jan. 16, 2007

(54) METHOD AND APPARATUS FOR DATA CODING FOR HIGH DENSITY RECORDING CHANNELS EXHIBITING LOW FREQUENCY CONTENTS

(75) Inventors: Yuan Xing Lee, San Jose, CA (US); Ismail Demirkan, La Jolla, CA (US); Richard L. Galbraith, Rochester, MN (US); Evangelos Eleftheriou, Zurich (CH); Roy D. Cideciyan, Rueschlikon (CH)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/903,978

(22) Filed: Jul. 30, 2004

(65) Prior Publication Data

US 2006/0022847 A1 Feb. 2, 2006

(51) Int. Cl.
*H03M 5/00* (2006.01)
(52) U.S. Cl. .............................. 341/58; 341/68; 341/69
(58) Field of Classification Search ................ 341/68, 341/58, 59, 51, 67, 28; 714/755, 800, 812; 360/31, 40, 45
See application file for complete search history.

(56) References Cited

U.S. PATENT DOCUMENTS

| | | | | |
|---|---|---|---|---|
| 3,810,111 A | | 5/1974 | Patel .......................... | 714/812 |
| 4,027,335 A | | 5/1977 | Miller ......................... | 360/40 |
| 5,731,768 A | * | 3/1998 | Tsang .......................... | 341/59 |
| 5,859,601 A | * | 1/1999 | Moon et al. .................. | 341/59 |
| 5,936,558 A | * | 8/1999 | Shafiee et al. ................ | 341/59 |
| 5,949,357 A | * | 9/1999 | Fitzpatrick et al. ........... | 341/68 |
| 5,995,543 A | * | 11/1999 | Kovacs et al. ................ | 375/230 |
| 6,011,497 A | * | 1/2000 | Tsang et al. .................. | 341/59 |
| 6,018,304 A | * | 1/2000 | Bessios ........................ | 341/58 |
| 6,052,072 A | * | 4/2000 | Tsang et al. .................. | 341/59 |
| 6,097,321 A | * | 8/2000 | Sayiner ........................ | 341/59 |
| 6,241,778 B1 | * | 6/2001 | de Lind van Wijngaarden et al. ............................ | 341/58 |
| 6,278,748 B1 | * | 8/2001 | Fu et al. ...................... | 375/341 |
| 6,388,587 B1 | * | 5/2002 | Brickner et al. .............. | 341/59 |
| 6,404,573 B1 | * | 6/2002 | Rub et al. .................... | 360/46 |
| 6,480,983 B1 | * | 11/2002 | Noda .......................... | 714/792 |
| 6,526,530 B1 | * | 2/2003 | Nazari et al. ................. | 714/701 |
| 6,538,585 B1 | * | 3/2003 | Liu .............................. | 341/59 |
| 6,581,184 B1 | * | 6/2003 | Saeki et al. .................. | 714/800 |
| 6,643,814 B1 | * | 11/2003 | Cideciyan et al. ............ | 714/755 |
| 6,664,905 B1 | * | 12/2003 | Coene ......................... | 341/102 |
| 6,707,624 B1 | | 3/2004 | Erden et al. .................. | 360/31 |
| 6,731,228 B1 | * | 5/2004 | Suh et al. ..................... | 341/58 |
| 6,741,412 B1 | | 5/2004 | Sawaguchi et al. ........... | 360/45 |
| 6,768,603 B1 | * | 7/2004 | Cideciyan et al. ............ | 360/45 |
| 6,778,105 B1 | * | 8/2004 | Suh et al. ..................... | 341/59 |
| 6,904,559 B1 | * | 6/2005 | Shieh .......................... | 714/795 |
| 7,030,784 B1 | * | 4/2006 | Schouhamer Immink .... | 341/50 |

OTHER PUBLICATIONS

Lee et al., "Data Coding for High Density Recording Channels Exhibiting Low Frequency Contents", Hitachi, Apr. 20, 2004, pp. 1-24.

(Continued)

*Primary Examiner*—Linh V. Nguyen
(74) *Attorney, Agent, or Firm*—David W. Lynch; Chambliss, Bahner & Stophel P.C.

(57) ABSTRACT

A method and apparatus for data coding for high-density recording channels exhibiting low frequency contents is disclosed. Coding is used that satisfies both Running Digital Sum (RDS) and Maximum Transition Run (MTR) properties, which are desirable for achieving high-density recording for recording channels exhibiting low frequency components such as perpendicular magnetic recording channel.

30 Claims, 41 Drawing Sheets

OTHER PUBLICATIONS

Immink et al., "Codes for Digital Recorders", IEEE Transactions of Information Theory, vol. 44, No. 6, Oct. 1998, pp. 2260-2299, no date.

van Wijngaarden, et al., "Maximum Runlength-Limited Codes with Error Control Capabilities", IEEE Journal on Selected Areas in Communications, vol. 19, No. 4, Apr. 2001, pp. 602-611, no date.

Braun et al., "An Enumerative Coding Technique for DC-Free Runlength-Limited Sequences", IEEE Transactions on Communications, vol. 48, No. 12, Dec. 2000, pp. 2024-2031, no date.

Stockmeyer et al., "Links Between Complexity Theory and Constrained Block Coding", IEEE Transactions on Information Theory, vol. 48, No. 1, Jan. 2002, pp. 59-60, no date.

Cideciyan et al., "Maximum Transition Run Codes for Generalized Partial Response Channels", IEEE Journal on Selected Areas in Communications, vol. 19, No. 4, Apr. 2001, pp. 619-634.

R.D. Cideciyan and E. Eleftheriou, "Codes Satisfying Maximum Transition Run and Parity-Check Constraints," *Proc. IEEE Int'l Communications Conf. "ICC '2004,"* Paris, France, Jun. 20-24, 2004, 5 pages.

R. Cideciyan and E. Eleftheriou, "Combined Modulation/Parity Codes for Magnetic Recording," *Proc. 2003 IEEE Int'l Symp. on Information Theory "ISIT 2003"*, Yokohama, Japan, Jul. 2003 (IEEE, Piscataway, NJ, 2003), p. 48, no date.

R. Adler, D. Coppersmith, and Martin Hassner, "Algorithms for Sliding Block Codes: An Application of Symbolic Dynamics to Information Theory," IEEE Transactions on Information Theory, vol. IT-29, No. 1, Jan. 1983, pp. 5-22, no date.

R. Cideciyan, E. Eleftheriou, B. Marcus, and D. Modha, "Maximum Transition Run Codes for Generalized Partial Response Channels," IEEE Journal on Selected Areas in Communications, vol. 19, No. 4, Apr. 2001, pp. 619-633, no date.

T. Conway, "A New Target Response with Parity Coding for High Density Magnetic Recording Channels," IEEE Transactions on Magnetics, vol. 34, No. 4, Jul. 1998, pp. 2382-2386, no date.

R. Cideciyan, J. Coker, E. Eleftheriou, and R. Galbraith, "Noise Predictive Maximum Likelihood Detection Combined with Parity-Based Post-Processing," IEEE Transactions on Magnetics, vol. 37, No. 2, Mar. 2001, pp. 714-720, no date.

J. Moon and B. Brickner, "Maximum Transition Run Codes for Data Storage Systems," *IEEE Trans. Magn.*, vol. 32, No. 5, Sep. 1996, pp. 3992-3994, no date.

W. G. Bliss, "An 8/9 Rate Time-varying Trellis Code For High Density Magnetic Recording," Magnetics Conference, 1997, Digests of INTERMAG '97, 1997 IEEE International, Apr. 1-4, 1997, p. BS-09.

K. Immink, P. Siegel, and J. Wolf, "Codes for Digital Recorders," IEEE Transactions on Information Theory, vol. 44, No. 6, Oct. 1998, pp. 2260-2299, no date.

P. Siegel And J. Wolf, "Modulation and Coding for Information Storage," IEEE Communications Magazine, Dec. 1991, pp. 68-86, no date.

K.A. Immink, "Codes for Mass Data Storage Systems," Shannon Foundation Publishers, the Netherlands, 1999, no month.

\* cited by examiner

900

3800

3802

3804

3806

METHOD AND APPARATUS FOR DATA CODING FOR HIGH DENSITY RECORDING CHANNELS EXHIBITING LOW FREQUENCY CONTENTS

BACKGROUND OF THE INVENTION

1. Field of the Invention

This disclosure relates in general to data channels, and more particularly to a method and apparatus for data coding for high density recording channels exhibiting low frequency contents.

2. Description of Related Art

When data are digitally recorded on, or read-back from, a recording medium, it is preferable that the data are recorded at a high density Because of the enormous increase in demand for data storage capacity, research on general recording systems has resulted in the investigation of many potential methods and architectures for increasing the capacity of storage media. This is also true for magnetic recording, for example in magnetic disk drive data storage systems in which architectures that may result in a higher areal density are being explored.

Recording systems typically employ Run-Length-Limited (RLL) codes to improve the write ability of the recording system and enhance read-back performance. In Non-Return-To-Zero-Inverted (NRZI) format where one denotes transition and zero no transition, RLL codes may be represented by (d, k) constraints, where d and k represent the minimum and maximum number of consecutive zeros between two adjacent ones respectively.

For an encoder encodes m information bits into n coded bits, the code rate is defined as ratio of m over n. The d constraint imposes the minimum separation between two adjacent transitions, while the k constraint helps gain and timing recovery loops in the readback process. The drawback of the d constraint is low code rate efficiency, which is not desirable for high-density recording channels equalized to partial response (PR) shapes.

As an alternative to imposing a constraint on the minimum separation between two adjacent transitions, one can relax this constraint and only limit the maximum number of consecutive transitions called the j constraint in sequence. The resultant codes are called MTR codes, which have much higher code rate efficiency than RLL codes with non-zero d. For example, the capacity of (1, k,) RLL code (in the limit with large k) is 0.6942, however the capacity of (0, k) MTR code with j=3 is 0.8791.

The error rate performance of recording systems equalized to PR shapes is largely dependent on their error events with minimum and near minimum squared distances, where an error event is defined as the difference sequence between two legal sequences in Non-Return-To-Zero (NRZ) format where 1 represents high amplitude, and 0 or −1 represents low amplitude, and the squared distance is defined as the sum of the square of an error event. For example, if the sequence of $\{1\ -1\ 1\}$ is mistakenly detected as $\{-1\ 1\ 1\}$, then the resultant error event is denoted as $\{+-+\}$, and the squared distance is 12. Some typical error events with small squared distances are $\{+\}$, $\{+-\}$, $\{+-+\}$, $\{+-+-\}$, $\{+0+\}$, $\{+00+\}$, and $\{+000+\}$, and their inverse correspondences.

The error event is denoted as the sequence that is obtained by periodically repeating the sequence s, e.g., $\{xy\}=xyxy$. In order to improve error rate performance, modern recording channels utilize parity code (also called parity mode) or Viterbi detector metrics of extended targets (also called parity-less mode) to detect certain small distance error events and make corrections on those error events. For example, in parity mode, 1-bit of even parity check may be applied to each codeword.

A channel detector may detect and therefore correct error events with odd weights in each codeword as error events with odd weights violate even parity check condition. In principle, parity mode or parity-less mode can detect certain types of error events and make right corrections on the detected error events with some small miscorrection probabilities. However at high density recording, error events with minimum and near minimum squared distances become clouded, regular error event correction may not be effective as it fails to make clear separations among possible error events with small distances.

Parity mode or parity-less mode processor makes miscorrections under those conditions that affect error rates after error-correction coding (ECC). MTR code on the other hand limits the maximum run of consecutive transitions to j. As a result, it eliminates many small distance error events which otherwise would occur at high-density recording. For example, MTR code with j=3 eliminates all four or more consecutive transitions. As a result, the error events with alternating signs $\{+-+-\ \ldots\}$ will be prevented from occurring.

The error rate performance of recording channels can be improved by combining both properties of MTR constraint and parity checking. For example, the MTR j=3 code with 2-bit parity checking eliminates $\{+-+-\ \ldots\}$ error events and corrects $\{+\}$, $\{+-\}$, $\{-+\}$, and $\{+00+\}$ error events. To further improve code efficiency, the j-constraint in MTR code can be relaxed to allow j+1 consecutive transitions to occur at certain pre-defined positions as long as those positions are separated by at least 1 bit interval.

This new class of MTR codes is called TMTR codes. For example, TMTR codes with j=3 allows j consecutive transitions to occur at odd positions, and j+1 consecutive transitions to occur at even positions. The TMTR codes with j=3 also eliminate $\{+-+-\ \ldots\}$ error events, but have much higher code efficiency. For example the TMTR codes with j=3 have capacity of 0.9163, which is 0.0372 higher than MTR codes with j=3. TMTR codes with parity checking have been found superior in performance than non-MTR coded channels with parity in both longitudinal and perpendicular recording systems under certain heads/disk combinations and operational conditions.

Recording channels such as longitudinal recording do not exhibit low frequency contents. These types of recording channels are called DC-free recording channels. The targets of channel detectors are also chosen to be DC-free to match the characteristics of recording channels. On the other hand, some recording channels such as perpendicular recording exhibit low frequency contents.

In longitudinal recording, the magnetic medium on the disc is magnetized parallel to the surface of the disc. In perpendicular recording, however, the medium is magnetized perpendicular to the surface of the disc. According to perpendicular magnetic recording, a recording (write) magnetic field generated from a main pole of the head forms a magnetic path in which the magnetic field is induced to the underlayer disposed on the rear of the recording magnetic layer and returned from an auxiliary pole to the recording head. By switching the direction of the recording magnetic field, the recording magnetic layer is magnetized in two directions towards the thickness of the medium in correspondence with the recording information code, thereby storing information. In such recording, an intensive and steep perpendicular recording (write) magnetic field can be applied to the recording magnetic layer, so that high-resolution information storage can be achieved. Moreover, when magnetized recording information is reproduced from the perpendicular magnetic recording medium recording the information, as described above, by the high-sensitive MR reproducing head using the MR device, a reproduced signal from the head has a rectangular-shaped signal waveform corresponding to the magnetized recording pattern which is sensed immediately by the head.

In addition to its potential to achieve higher areal densities, the specific nature of perpendicular recording also brings its own difficulties. The targets of a channel detector may be chosen to have low-frequency contents to better match the nature of the recording systems. The targets of a channel detector may be categorized into three groups, DC-free targets, DC-full targets, and DC-attenuated targets. The DC-full targets are the ones that exhibit full DC-response or full low frequency energy matching recording systems, while DC-attenuated targets exhibit some low frequency energy which lie in between DC-full targets and DC-free targets in terms of low frequency contents.

If the noise presented to the signal is white, then DC-full targets will be the best choice since they best match the recording channel responses. However if noise is not white, then DC-full targets may not be the best choice in terms of minimum mean square errors (MMSE). For example, the media noise present in modern recording systems is low frequency noise whose spectral shape is similar to channel responses.

With noise pronounced at low frequencies, DC-attenuated targets may become the better choice in balancing signal energy and noise power at low frequencies. The DC-attenuated targets approach DC-free targets when increasingly suppressing DC and low frequency contents. DC-free targets sharply suppress low frequency noise, but also totally eliminate signal energy at DC and heavily suppress signal energy at low frequencies, resulting in losses in signal-to-noise ratio (SNR). For encoded recording systems exhibiting low frequency contents, DC-attenuated targets become favorable choice for improving SNR.

Even though channel detector targets can be DC-full or DC-attenuated, in practice there are AC coupling filters in recording systems and signals entering the read-paths of recording channels are AC coupled. The impact of AC coupling is the removal of low frequency contents in read-back signals, causing signals entering channel detectors to have perturbations at baselines, a phenomenon called baseline wander. Baseline wonder has an adverse impact on channel error rate performance.

One way to compensate for the baseline wander is to apply DC-compensation loops into channels to restore low frequency contents into incoming signals. The effectiveness of DC-compensation is dependent on the high-pass pole frequencies in AC-coupling networks. The higher the high-pass pole frequencies, the harder for DC-compensation loops to work effectively. DC-compensation loop works just like a decision-feedback equalizer (DEF) system, which may be sensitive to error propagation.

The different approach to solving baseline wonder from AC-coupling network for DC-attenuated targets is to apply DC-free or RDS codes to data sequences so that read-back signals from recording channels have much attenuated low frequency components and AC-coupling network will have no or much less impact on read-back signal entering channel equalizer and detector. In digital recording, the spectral null constraints of most importance have been those that prescribe a spectral null at or DC. The sequences are said to be DC-free or charge-constrained. The concept of running digital sum (RDS) of a sequence plays a significant role in the description and analysis of DC-free sequences. For a bipolar sequence $\omega = \omega_0, \omega_1, \ldots \omega_{L-1}$, the RDS of a subsequence $\omega_\square, \ldots \omega_{\square'}$, denoted $RDS(\omega_\square, \ldots \omega_{\square'})$ is defined as $$RDS(\omega_\square, \ldots \omega'_\square) = \sum_{i=l}^{l'} \omega_i.$$

Thus, the spectral density of the sequences vanishes if and only if the RDS values for all sequences are bounded in magnitude by some constant integer.

With the aid of DC-free codes, the DC-compensation loops can be eliminated and channel detector targets can still be selected to include low-frequency energy to better match recording system responses. The main advantage of using RDS codes is that DC-full or DC-attenuated targets can be applied without the need of DC-compensation loops.

DC-full or DC-attenuated targets may produce better error rate performance than DC-free targets under normal operational conditions, but are vulnerable to any low frequency distortions or disturbances that may appear under special conditions. One example is the existence of thermal asperity (TA) disturbance that today's magnetic recording systems experience. TA is a low frequency distortion, which has catastrophic impact on channel detectors that respond to low frequencies.

To eliminate the sensitivity of channel detectors to low frequency disturbances and also minimize the losses in SNR of detectors under normal conditions, RDS codes are used in connection with DC-free targets. DC-free targets suppress low frequency noise and also signal energy at low frequencies. But since signals at low frequencies have little energy due to the RDS constraint, DC-free targets may improve spectral SNR at low frequencies. The improvement of spectral SNR at low frequencies can be achieved by matching the spectrum of RDS codes to that of DC-free targets at low frequencies.

In practical uses in magnetic recording, code rates of RLL codes are preferred to be high in order to achieve good overall error rate performances. The RDS codes are also preferred to have high code rate efficiency for being used in magnetic recording channels. The higher the code rates, the less attenuations of energy at low frequencies, even though energy at DC approaches to zero. In order to match the spectrum of high code rate codes at low frequencies, DC-free targets need to be longer than conventional DC-free targets so that more boosts at low frequencies can be realized. One way to implement long DC-free targets is through post-processing.

As have been seen above, both properties of RDS and MTR constraints are desirable for recording channels exhibiting low frequency contents. However RDS codes do not impose any constraint on j-constraint of data sequences. The RDS coded sequences may have long strings of consecutive transitions. On the other hand, MTR or TMTR codes do not impose any constraint on RDS values of data sequences, and may result in un-bounded RDS values.

Known coding solutions use either MTR/TMTR codes or RDS codes separately. However, the advantages of MTR/TMTR codes and the advantages of RDS codes cannot be realized at the same time due to the fact that the MTR/TMTR codes and RDS codes are different codes.

It can be seen then that there is a need for a method and apparatus for performing data coding for high-density recording channels exhibiting low frequency contents that takes advantage of both RDS and MTR or TMTR constraints.

SUMMARY OF THE INVENTION

To overcome the limitations described above, and to overcome other limitations that will become apparent upon reading and understanding the present specification, the present invention discloses a method and apparatus for data coding for high density recording channels exhibiting low frequency contents.

The present invention solves the above-described problems by providing a technique for coding data sequence satisfying both Running Digital Sum (RDS) and Maximum Transition Run (MTR) properties, which are desirable for achieving high density recording for recording channels exhibiting low frequency components such as perpendicular magnetic recording channel. This new class of codes is named as RDS-MTR codes. To achieve high code rates, the MTR constraint of RDS-MTR codes is relaxed to allow timing varying MTR (TMTR) properties. The resultant codes are called RDS-TMTR codes. The techniques according to an embodiment of the present invention may be extended to the design of RDS-MTR or RDS-TMTR codes incorporated with parity check bits. Perpendicular recording channels may make use of codes that satisfy both properties of RDS and MTR to provide substantial error rate performance advantages over conventional methods using either MTR or RDS codes alone.

A method for data coding for high density recording channels exhibiting low frequency contents in accordance with the principles of the present invention includes combining a maximum transition run constraint including timing-varying maximum transition run thereafter with a running digital sum constraint, choosing a combined code having a desired capacity, integrating a plurality of constraints into the chosen code to provide a constrained code, concatenating a plurality of the constrained code to produce a code having a desired code rate, adding at least one polarity bit to the concatenation of codewords to provide dc-free sequences and eliminating additional error events using N-bit parities with the concatenated codeword having the added polarity bit.

In another embodiment of the present invention, a data storage system is provided. The data storage system includes a translatable recording medium for storing data thereon, a motor for translating the recording medium, a transducer disposed proximate the recording medium for reading and writing data on the recording medium, an actuator, coupled to the transducer, for moving the transducer relative to the recording medium and a read/write channel, coupled to the transducer, the read/write channel including a processor configured for processing data on the recording medium and for encoding data for high density channels exhibiting low frequency content using a code satisfying both a maximum transition run constraint and running digital sum constraint, having a desired capacity and code rate governed by the capacity.

In another embodiment of the present invention, a code for high-density recording channels exhibiting low frequency contents is provided. The code includes a concatenation of maximum transition run codes having a desired capacity, wherein the maximum transition run codes integrates a plurality of constraints and the concatenation of maximum transition run codes includes a polarity bit to provide dc-free sequences and uses 2-bit parities to eliminate additional error events.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus for data coding for high-density recording channels exhibiting low frequency contents. The present invention provides codes that satisfy both Running Digital Sum (RDS) and Maximum Transition Run (MTR) properties to achieve high-density recording for recording channels exhibiting low frequency components such as perpendicular magnetic recording channel.

Figure 1:
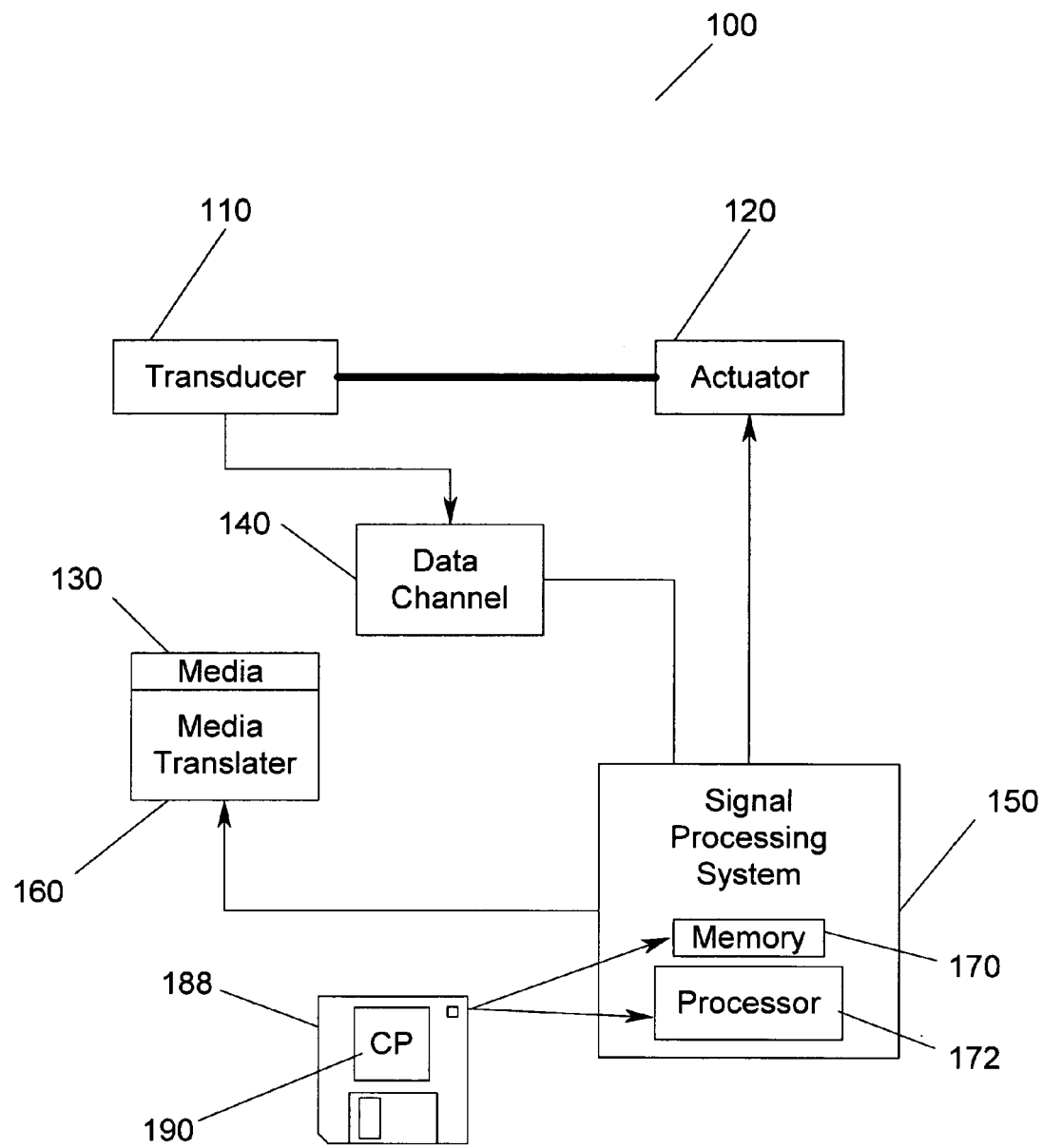
FIG. 1 illustrates a storage system according to an embodiment of the present invention.

FIG. 1 illustrates a storage system 100 according to an embodiment of the present invention. In FIG. 1, a transducer 110 is under control of an actuator 120. The actuator 120 controls the position of the transducer 110. The transducer 110 writes and reads data on magnetic media 130. The read/write signals are passed to a data channel 140. A signal processor system 150 controls the actuator 120 and processes the signals of the data channel 140. In addition, a media translator 160 is controlled by the signal processor system 150 to cause the magnetic media 130 to move relative to the transducer 110. Nevertheless, the present invention is not meant to be limited to a particular type of storage system 100 or to the type of media 130 used in the storage system 100.

Figure 2:
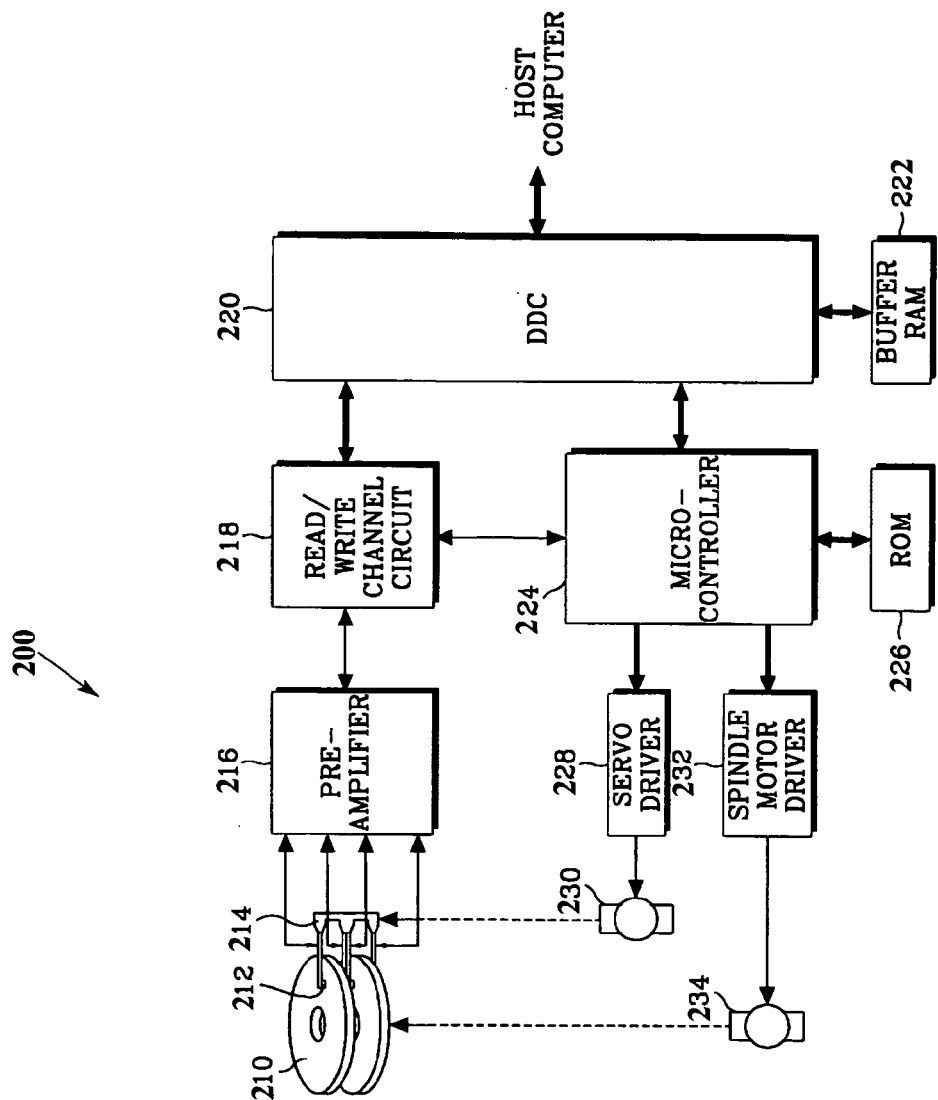
FIG. 2 is a block diagram of a magnetic disk drive device according to an embodiment of the present invention.

FIG. 2 is a block diagram of a magnetic disk drive device 200 according to an embodiment of the present invention. In FIG. 2, disks 210 are rotated by a spindle motor 234, and heads 212 are positioned at surfaces of corresponding ones of disks 210. Heads 212 are mounted on corresponding servo arms that extend from an E-shaped block assembly 214 to disks 210. Block assembly 214 has an associated rotary voice coil actuator 230 that moves block assembly 214 and thereby changes to positions of heads 212 for reading data from or writing data to a specified position on one or more of disks 210.

A pre-amplifier 216 pre-amplifies a signal picked up by heads 212 and thereby provides read/write channel circuit 218 with an amplified signal during a reading operation. During a write operation, pre-amplifier 216 transfers an encoded write data signal from the read/write channel circuit 218 to heads 212. In a read operation, read/write channel circuit 18 detects a data pulse from a read signal provided by pre-amplifier 216 and decodes the data pulse. Read/write channel circuit 218 transfers the decoded data pulse to a disk data controller (DDC) 20. Furthermore, read/write channel circuit 18 also decodes write data received from the DDC 220 and provides the decoded data to pre-amplifier 216.

DDC 220 both writes data received from a host computer (not shown) onto disks 210, through read/write channel circuit 18 and pre-amplifier 216, and transfers read data from disks 210 to the host computer. DDC 220 also interfaces between the host computer and a microcontroller 224. A buffer RAM (Random Access Memory) 222 temporarily stores data transferred between DDC 220 and the host computer, microcontroller 224, and read/write channel circuit 218. Microcontroller 224 controls track seeking and track following functions in response to read and write commands from the host computer.

A ROM (Read Only Memory) 226 stores a control program for microcontroller 224 as well as various setting values. A servo driver 228 generates a driving current for driving actuator 230 in response to a control signal, generated from microcontroller 224 that provides control of the position of heads 212. The driving current is applied to a voice coil of actuator 230. Actuator 230 positions heads 212 relative to disks 210 in accordance with the direction and amount of the driving current supplied from servo driver 228. A spindle motor driver 232 drives spindle motor 234, which rotates disks 210, in accordance with a control value generated from microcontroller 224 for controlling disks 210.

Figure 3:
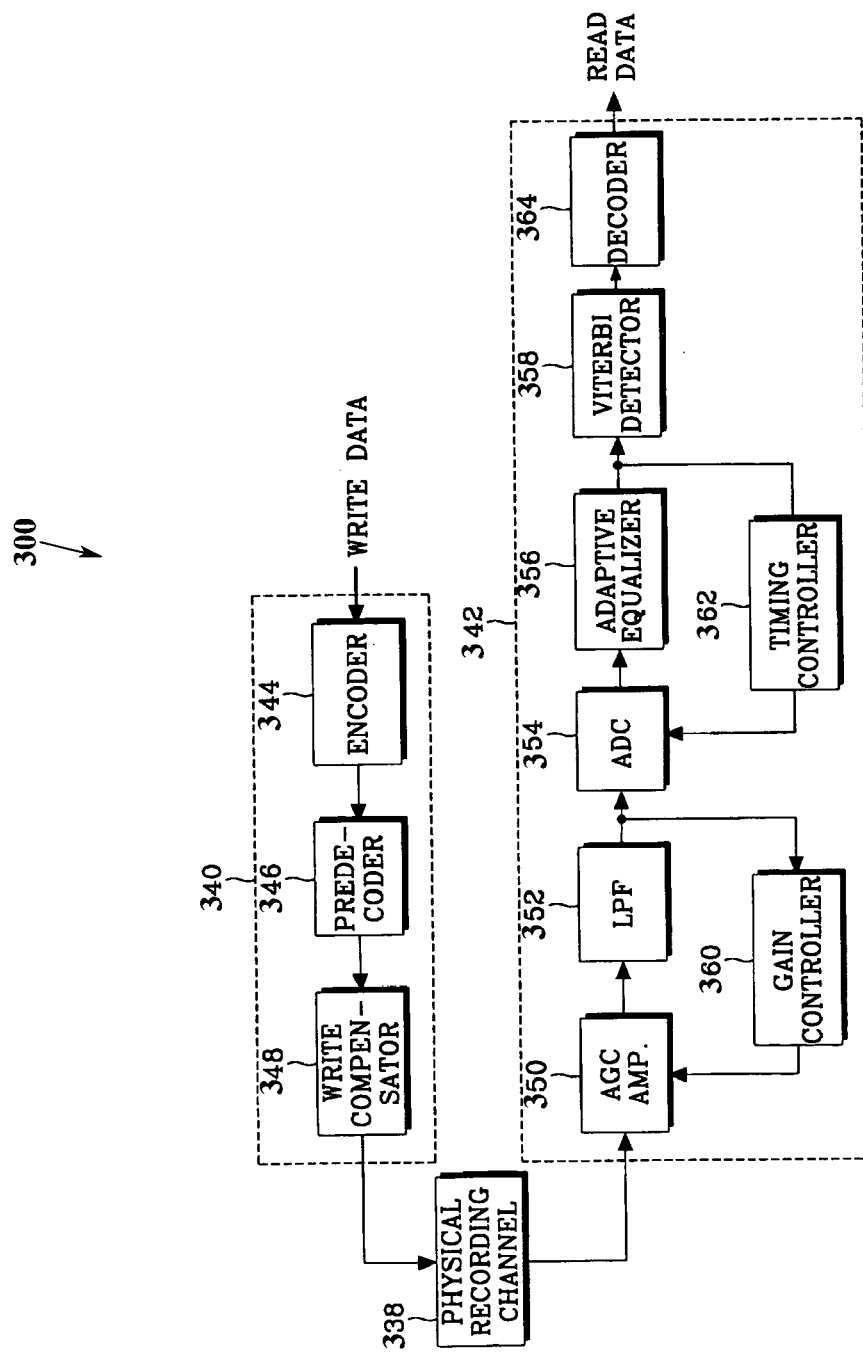
FIG. 3 is a block diagram of a read/write channel circuit of FIG. 2 that employs PRML detection.

FIG. 3 is a block diagram of a read/write channel circuit 300 of FIG. 2 that employs PRML detection. In FIG. 3, the read/write channel circuit 300 includes a physical recording channel 338 having a read/write means and a recording medium, a write channel circuit 340 for writing data onto the recording medium, and a read channel circuit 342 for reading data from the recording medium. Write channel circuit 340 is composed of an encoder 344, a pre-decoder 346, and a write compensator 348. Read channel circuit 342 is composed of an automatic gain control (AGC) amplifier 350, a low pass filter (LPF) 352, an analog-to-digital converter (ADC) 354, an adaptive equalizer 356, a Viterbi detector 358, a gain controller 360, a timing controller 362, and a decoder 364.

In operation, encoder 344 encodes write data, input to be written onto the recording medium, into a predetermined code according to an embodiment of the present invention as described herein below. Pre-decoder 346 is included to prevent error propagation. Write compensator 348 reduces non-linear influences arising from the read/write head. However, because the response of the actual recording channel does not exactly coincide with this transfer function, some subsequent equalization may be required.

Automatic gain control (AGC) amplifier 350 amplifies an analog signal read from the disk. Low pass filter 352 removes high frequency noise from and reshapes the signal output from AGC amplifier 350. The signal output from low pass filter 352 is converted into a discrete digital signal by analog-to-digital (A/D) converter 354. The resulting digital signal may then be applied to adaptive equalizer 356, which adaptively controls inter-symbol interference (ISI) to generate desired waveforms. Viterbi detector 358 receives the equalized signal output from adaptive equalizer 356 and from it generates encoded data. Decoder 64 decodes the encoded data output from Viterbi detector 358 to generate the final read data. At the same time, in order to correct the analog signal envelope and the digitization sample timing, gain controller 360 controls the gain of AGC amplifier 350 and timing controller 362 controls sample timing for A/D converter 354.

Figure 4:
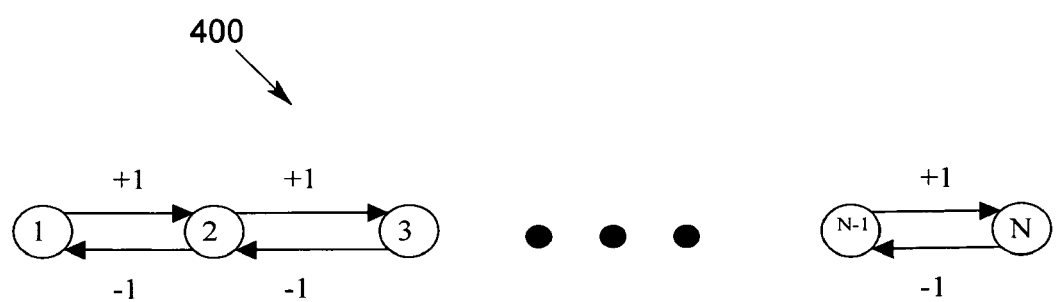
FIG. 4 illustrates a FSTD of RDS codes in terms of NRZ format.

FIG. 4 illustrates a FSTD of RDS codes in terms of NRZ format 400. Various constraints of practical interest are often specified using finite-state transition diagrams (FSTDs). An FSTD is a directed graph with edges labeled; the vertices are thought of as states. A finite binary word generated by following some walk on the graph from some (arbitrary) state to another (possibly the same, arbitrary) state is known as a constrained sequence. The set of all such constrained sequences is the constraint defined by the FSTD. RDS codes can be characterized by the RDS values of the coded sequences. The RDS should be bounded at any given position in coded sequences. The attenuation on low frequency components in coded sequences is dependent on the ratio of the RDS and length of the coded sequences. The FSTD of RDS codes 400 as shown in FIG. 4 are usually represented in terms of NRZ format.

The above FSTD 400 generates sequences whose RDS value is confined to N possible levels 410. When the length of sequences approaches to infinity, their spectrums tend to have a null at DC frequency. Because of this, sequences constrained with RDS are also called max-entropic dc-free sequences.

MTR codes are best described in terms of NRZI. For the combination of the RDS property with MTR property, the FSTD of RDS codes is first obtained in terms of NRZI format. The NRZI domain representation of RDS constraint 500 is shown in FIG. 5, which is the Moore-type representation of the FSTD 300 of FIG. 4.

Figure 5:
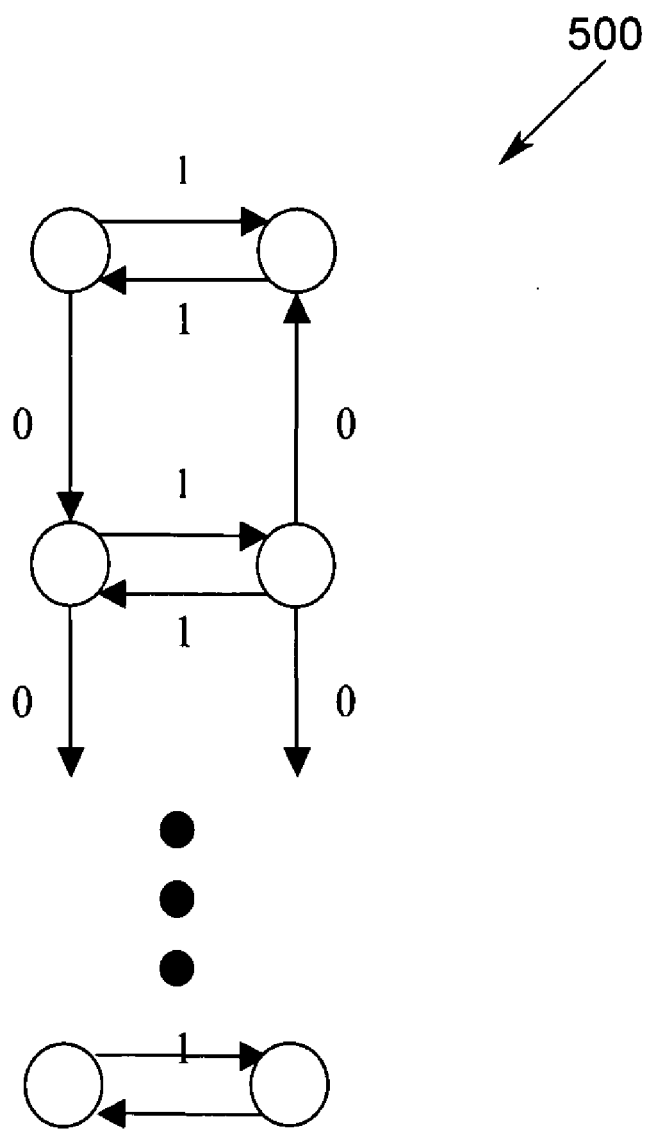
FIG. 5 illustrates a FSTD of RDS codes in terms of NRZI format.

There are 2(N−2) states in the representation 500 shown in FIG. 5, whereas original representation 400 of FIG. 4 has only N. The capacity of this constraint is analytically known as:

$$C(N) = \log_2 2\cos\frac{\pi}{N+1}, N \geq 3. \quad (1)$$

Figure 6:
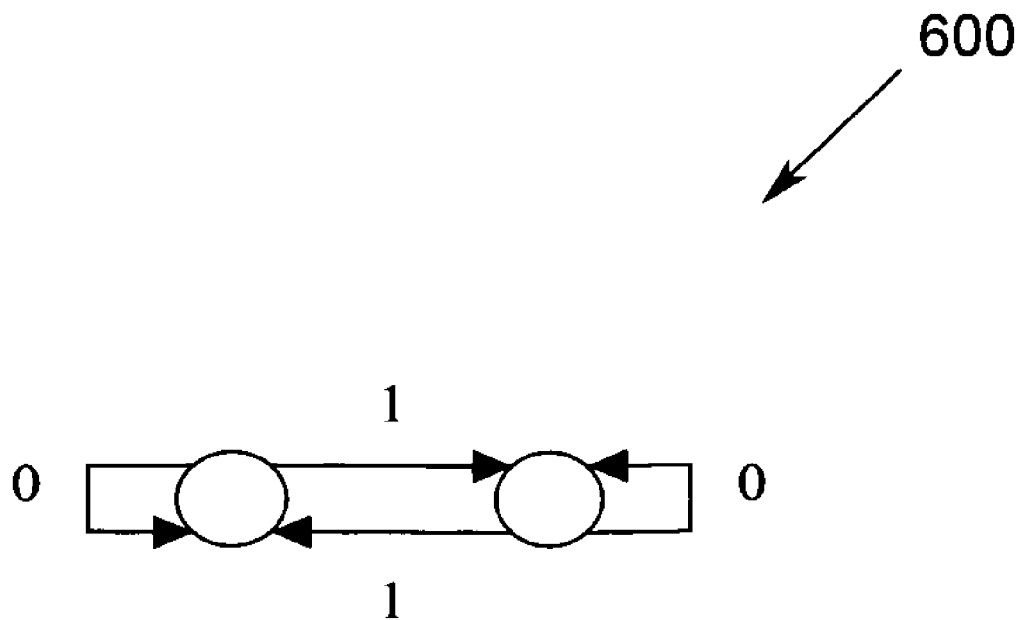
FIG. 6 illustrates a FSTD of RDS codes in terms of NRZI format when N=∞.

For N=1, 2, C(N)=0. When N=∞, the FSTD of RDS codes in terms of NRZI format 600 is shown in FIG. 6. Some capacity values of RDS constrained codes are shown in Table 1 below.

TABLE 1

| N | C(N) |
|---|------|
| 3 | 0.5000 |
| 4 | 0.6942 |
| 5 | 0.7925 |
| 6 | 0.8495 |
| 7 | 0.8858 |
| 8 | 0.9103 |
| 9 | 0.9276 |
| 10 | 0.9403 |
| 12 | 0.9575 |
| 14 | 0.9681 |
| 16 | 0.9752 |
| 18 | 0.9802 |
| 20 | 0.9838 |
| 24 | 0.9886 |
| 28 | 0.9915 |
| 32 | 0.9935 |

TABLE 1-continued

| N | C(N) |
|---|------|
| 36 | 0.9948 |
| 40 | 0.9958 |
| ∞ | 1.0000 |

Figure 7:
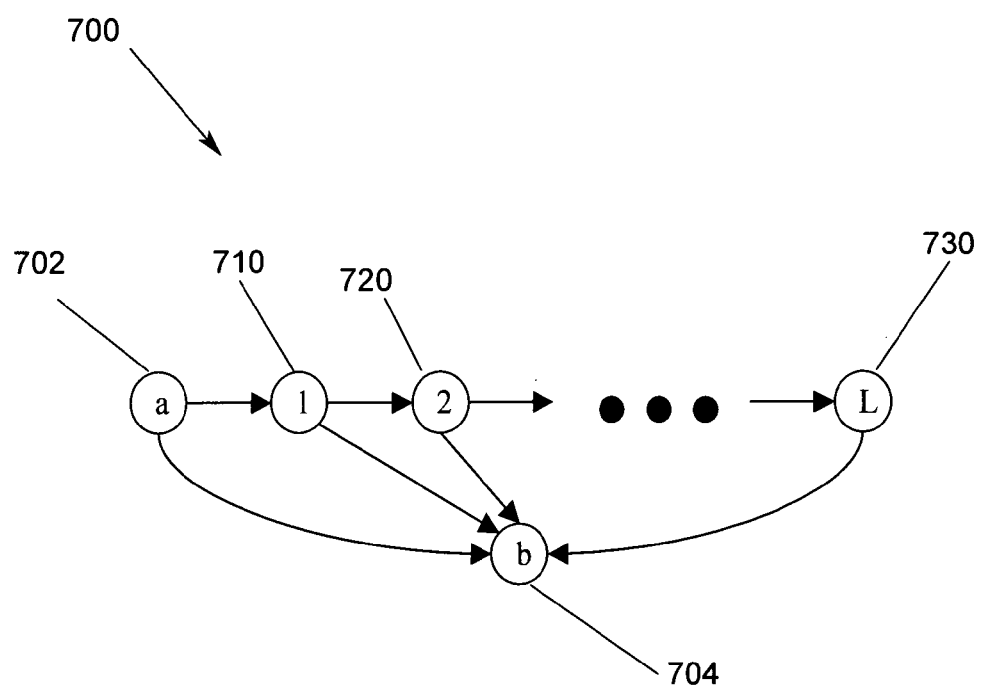
FIG. 7 illustrates a FSTD showing the connections between a state a and a state b.

Due to the complexity of FSTD for combined codes, i.e., RDS-MTR and RDS-TMTR, a compact representation will be described herein. A diagram 700 showing the connection between state a and b is illustrated in FIG. 7. States 1 710 through L 730 are called intermediate states. State a 702 is called starting state and state b 704 is called merging state.

Figure 8:
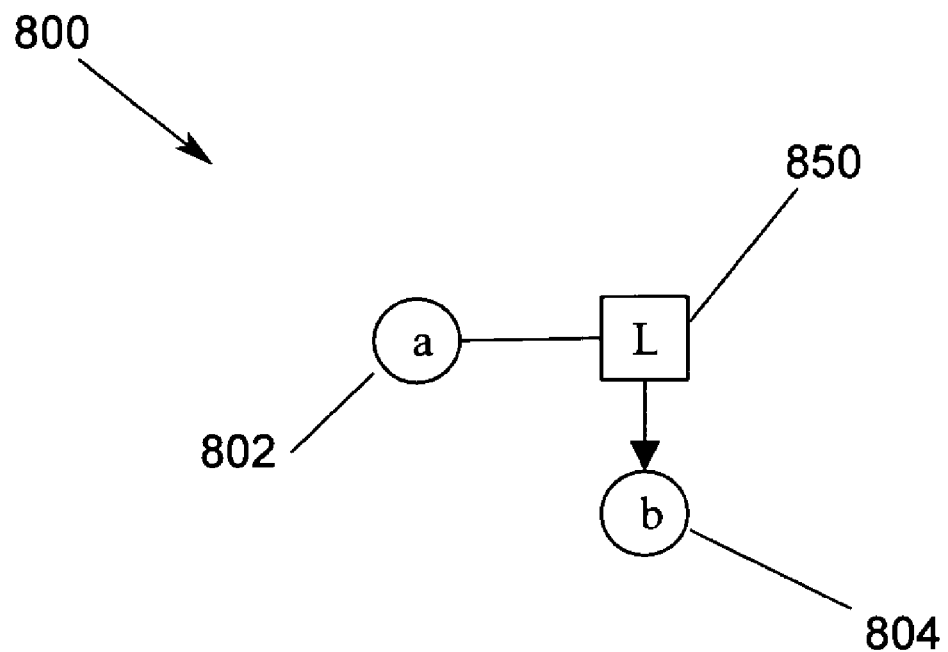
FIG. 8 illustrates a shortened representation of FIG. 7.
Figure 9:
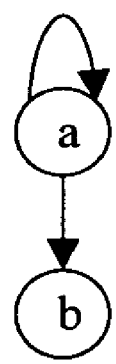
FIG. 9 illustrates a representation of FIG. 8 with L=∞.

FIG. 8 illustrates a shortened representation 800 of FIG. 7. In FIG. 8, the intermediate states 710, 720, 730 shown in FIG. 7 are represented via a square that has label L 850. When L=0, state a 802 and state b 804 will be connected directly and there will be no other connections. FIG. 9 illustrates the connections with L=∞ 900.

Figure 10:
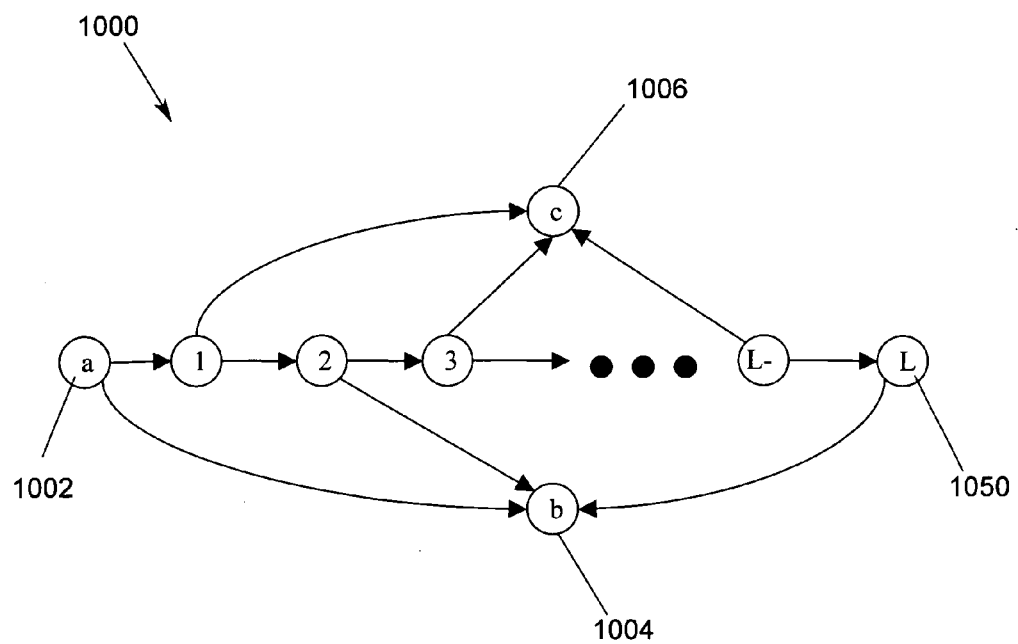
FIG. 10 is a FSTD showing the connections between states a, b and c.
Figure 11:
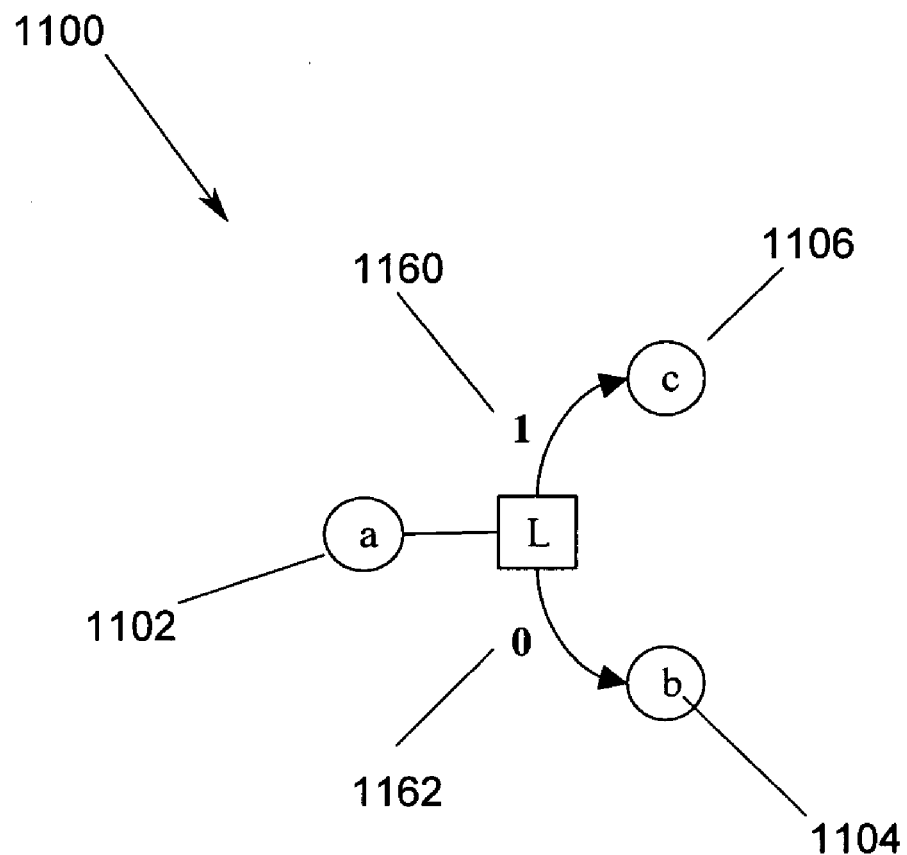
FIG. 11 illustrates a shortened representation of FIG. 10.

FIG. 10 is a diagram 1000 showing the connections between state a 1002, state b 1004 and state c 1006. In FIG. 10, there are L intermediate states 1050 that are connecting state a 1002 to state b 1004 and state c 1006 in the way of interleaving connections. FIG. 11 is a compact representation 1100 of connections between state a 1102, state b 1104 and state c 1106.

Figure 12:
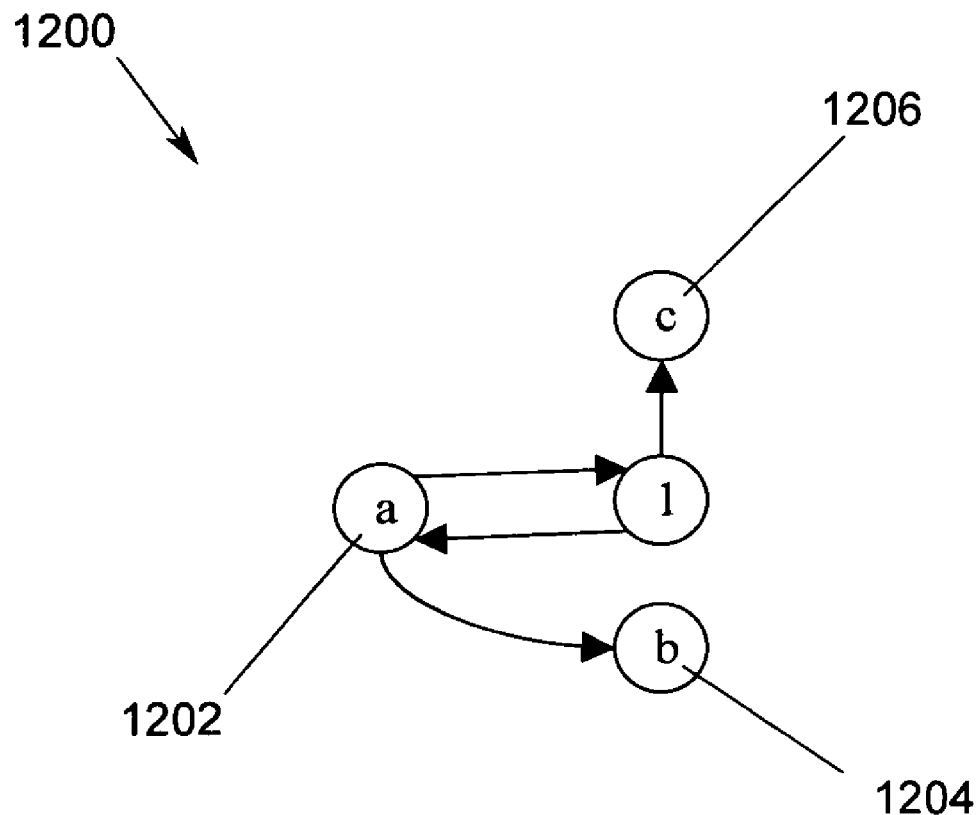
FIG. 12 illustrates a representation of FIG. 11 with L=∞.

In FIG. 11, the labels of arrows 1160, 1160 are not related to NRZI transitions 0 and 1. Rather, label 0 1162 means state a 1102 and state b 1104 are connected via odd number of edges and even number of intermediate states. Likewise, label 1 1160 means state a 1102 and state c 1106 are connected via even number of edges and odd number of intermediate states. When L=0, state a 1102 and state b 1104 will be connected directly and there will be no other connections, e.g., to state c 1106. FIG. 12 is a shortened representation 1200 of the connection between state a 1202 to state b 1204 and state c 1206 when L=∞.

Figure 13:
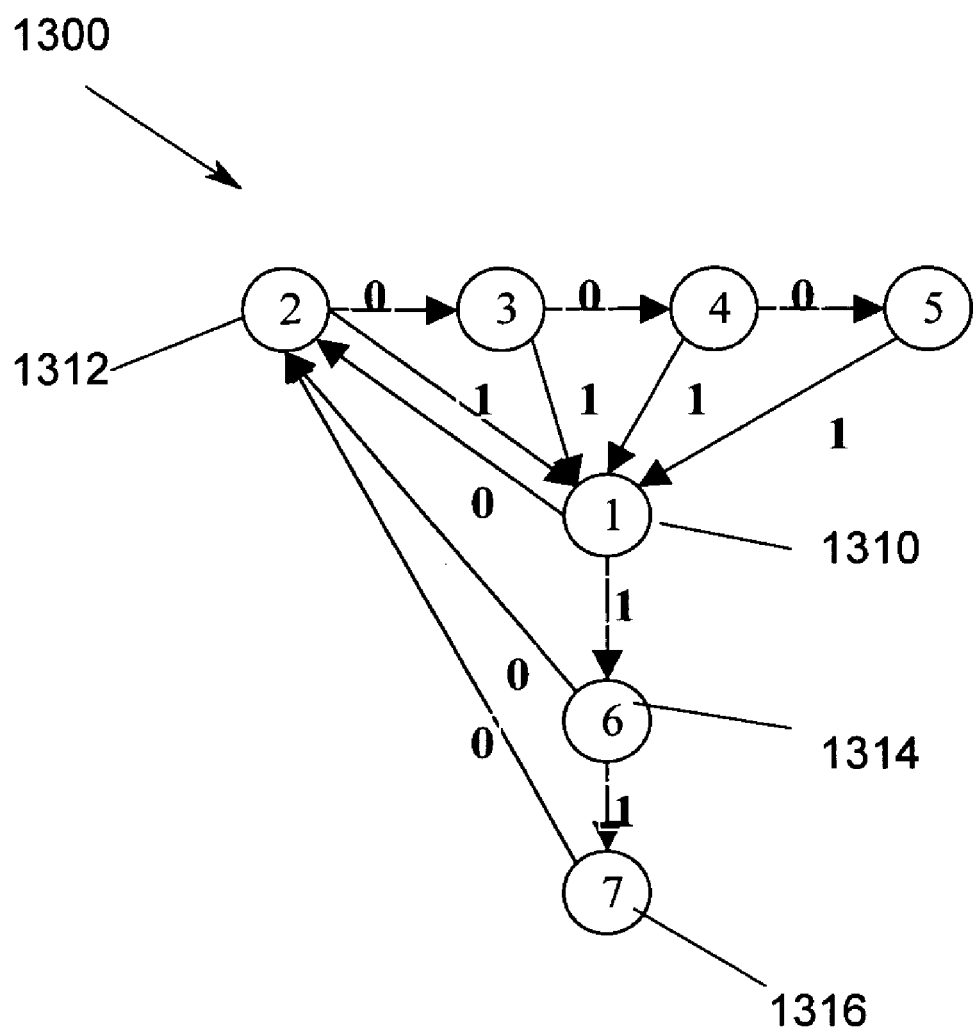
FIG. 13 is a FSTD of j=3 (0, 4) MTR code in NRZI format.
Figure 14:
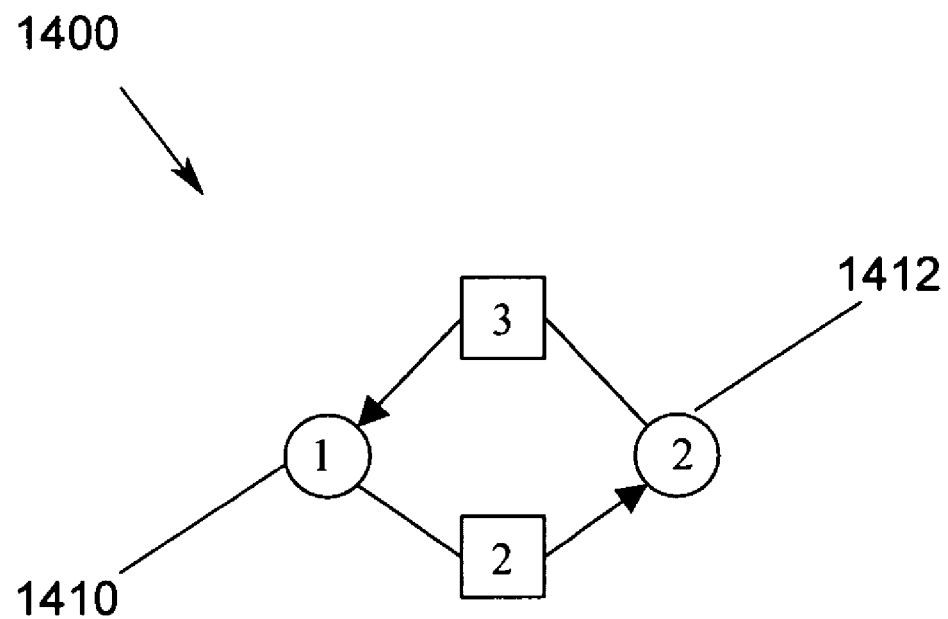
FIG. 14 illustrates a shortened representation of FIG. 13.

Now considering FSTDs of MTR codes, a FSTD of j=3 (0, 4) MTR code in NRZI format 1300 can be represented as shown in FIG. 13. State 1 1310 is connected to state 2 1312 not only directly, but also via state 6 1314 and state 7 1316. Hence there is a connection from state 1 1310 to state 2 1312 with L=2. Likewise, there is a connection from state 2 1312 to state 1 1310 with length L=3. Thus, FIG. 13 can be represented by shortened representation 1400 shown in FIG. 14. Note that the labels of internal connections are implicit. State 1 1410 is referred as merging state of 1's, whereas state 2 1412 is referred as merging state of 0's.

Figure 15:
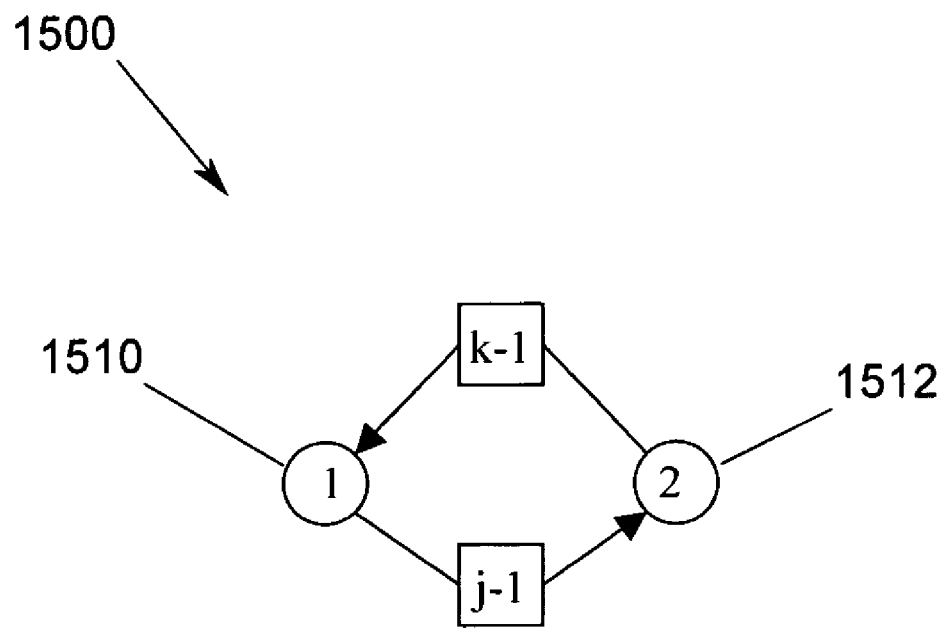
FIG. 15 is a shortened representation of FSTD of (0, k) MTR code with constraint j in NRZI format.

In general, (0, k) MTR code with the j constraint can be compactly represented using a shortened representation 1500 as shown in FIG. 15. State 1 1510 and 2 1512 have the same meaning as before. Note, the internal labeling of boxes is not shown. This is because as long as the graph is deterministic, the capacity does not change. In a deterministic graph, for each state, outgoing edges are labeled distinctly. A determination may be made whether the above graph 1500 approaches the original graph when k=∞ and/or j=∞. The capacity of any FSTD can be computed using the following formula $$C = \log_2 \lambda \quad (2)$$

where λ is the largest eigenvalue of the connection matrix of FSTD.

The capacity table of MTR constraint for some values of j and k is presented in Table 2.

TABLE 2

| k | j=1 | j=2 | j=3 | j=4 | j=5 | j=6 | j = ∞, $C_k$ |
|---|---|---|---|---|---|---|---|
| 1 | 0.0000 | 0.4057 | 0.5515 | 0.6174 | 0.6509 | 0.6690 | 0.6942 |
| 2 | 0.4057 | 0.6942 | 0.7947 | 0.8376 | 0.8579 | 0.8680 | 0.8791 |
| 3 | 0.5515 | 0.7947 | 0.8791 | 0.9146 | 0.9309 | 0.9388 | 0.9468 |
| 4 | 0.6174 | 0.8376 | 0.9146 | 0.9468 | 0.9614 | 0.9684 | 0.9752 |
| 5 | 0.6509 | 0.8579 | 0.9309 | 0.9614 | 0.9752 | 0.9818 | 0.9881 |
| 6 | 0.6690 | 0.8680 | 0.9388 | 0.9684 | 0.9818 | 0.9881 | 0.9942 |
| 7 | 0.6793 | 0.8732 | 0.9427 | 0.9718 | 0.9850 | 0.9912 | 0.9971 |
| 8 | 0.6853 | 0.8760 | 0.9447 | 0.9735 | 0.9865 | 0.9927 | 0.9986 |
| 9 | 0.6888 | 0.8774 | 0.9457 | 0.9744 | 0.9873 | 0.9934 | 0.9993 |
| 10 | 0.6909 | 0.8782 | 0.9462 | 0.9748 | 0.9877 | 0.9938 | 0.9996 |
| 12 | 0.6930 | 0.8789 | 0.9466 | 0.9751 | 0.9880 | 0.9941 | 0.9999 |
| 14 | 0.6938 | 0.8791 | 0.9467 | 0.9752 | 0.9881 | 0.9942 | 1.0000 |
| 16 | 0.6941 | 0.8791 | 0.9468 | 0.9752 | 0.9881 | 0.9942 | 1.0000 |
| 18 | 0.6942 | 0.8791 | 0.9468 | 0.9752 | 0.9881 | 0.9942 | 1.0000 |
| 20 | 0.6942 | 0.8791 | 0.9468 | 0.9752 | 0.9881 | 0.9942 | 1.0000 |
| ∞ | 0.6942 | 0.8791 | 0.9468 | 0.9752 | 0.9881 | 0.9942 | 1.0000 |

As expected, the capacities of (0, k) MTR approaches to those of regular (0, k) RLL codes when $j \to \infty$. Note that the last digit of every entry is rounded.

Next, the FSTD of TMTR codes with period 2 will be discussed. At even time indices the MTR is limited to j. However, at odd time indices MTR is relaxed to j+1. The TMTR codes can eliminate the same types of error events as their original MTR codes but have much higher code rates. For example, j=3 MTR codes eliminate all the errors of types {+−+− . . . }. There are only two cases where these error types can occur. One is that any 4 consecutive transitions being shifted either early or late by 1-bit, the other one is that 5 consecutive transitions being detected as 3 consecutive transitions. The j=3 MTR codes eliminate both cases because they do not support consecutive transitions longer than 3. For j=3 TMTR codes, they only allow 4 consecutive transitions to occur at alternate positions, therefore preventing errors of types {+−+− . . . } from occurring. In TMTR codes, a state is called even/odd if the next outgoing bit at an even/odd time index.

Figure 16:
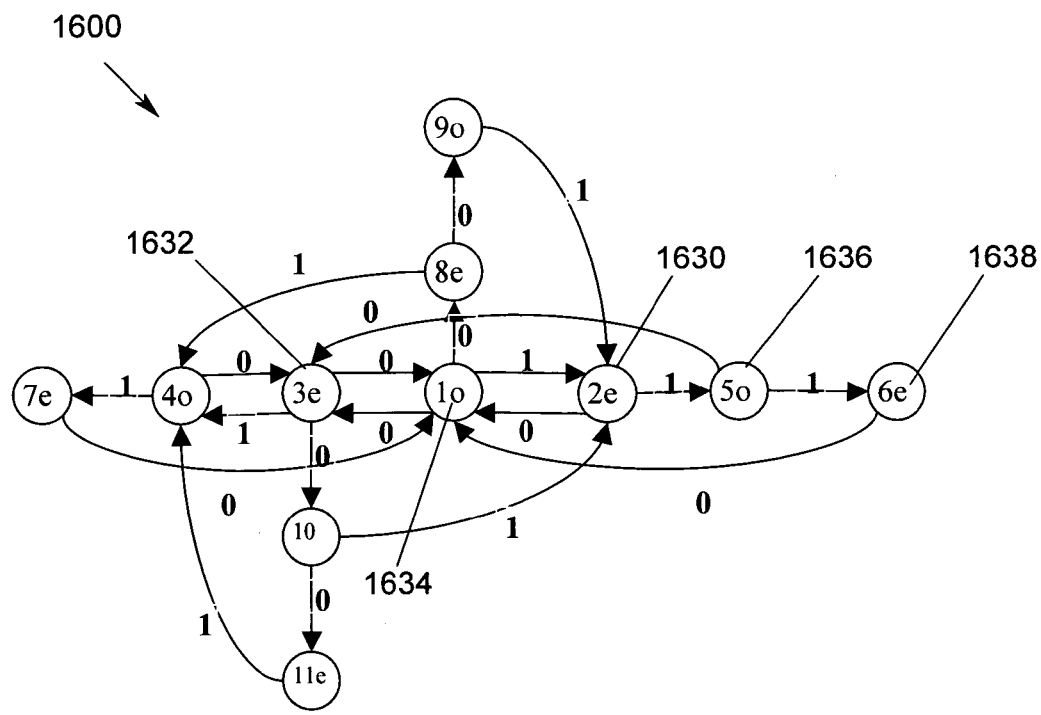
FIG. 16 is a FSTD of j=3 (0, 2) TMTR code in NRZI format.
Figure 17:
FIG. 17 illustrates a shortened representation of FIG. 16.
Figure 17:
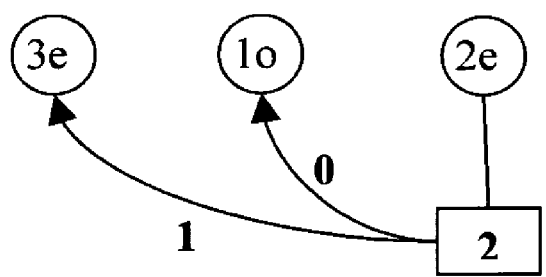

FIG. 16 illustrates an example of a FSTD of j=3 (0, 2) TMTR code in terms of NRZI 1600. In FIG. 16, even and odd states are indicated with letters "e" and "o" respectively. Although the FSTD 1600 seems complicated, one can extract 4 shortened connections out of graph 1600 of FIG. 16. For instance, consider the connections starting from 2e 1630. The connections merge at either 3e 1632 or 1o 1634, where 5o 1636 and 6e 1638 are intermediate states. Hence, a graph 1600 as that in FIG. 16 may be represented as a shortened graph 1700 as shown in FIG. 17.

Figure 18:
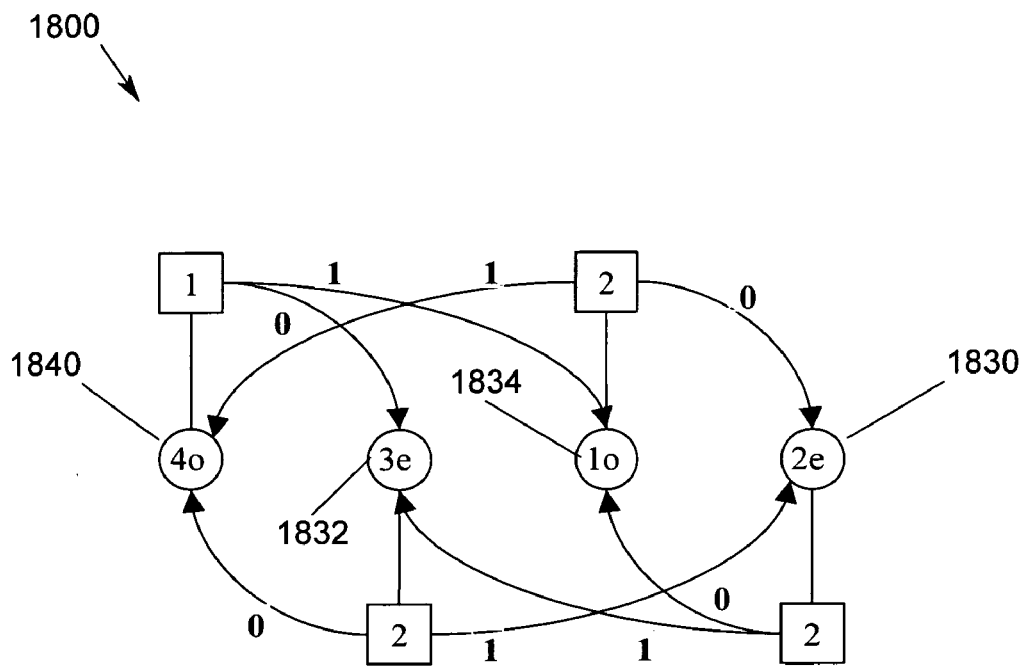
FIG. 18 illustrates a shortened representation between state 2e and other states for the FSTD of FIG. 16.
Figure 19:
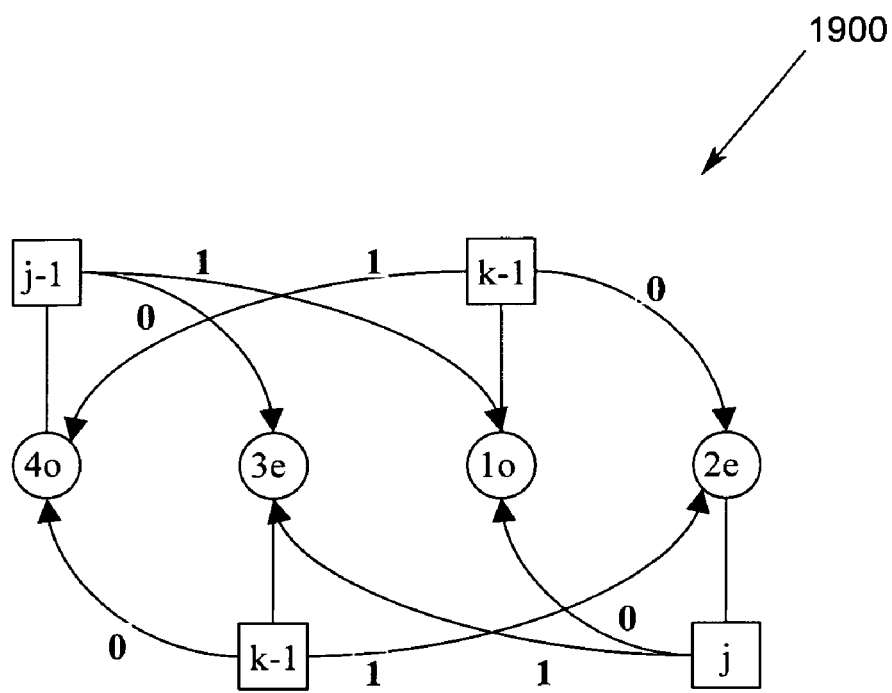
FIG. 19 is a generalized illustration of (0, k) TMTR codes with constraint j.

FIG. 18 is a graph 1800 that illustrates connections between state 2e 1830 and other states. The connections emerging from 2e 1830 and 4o 1840 are related to the j parameter, whereas the outgoing paths of 3e 1832 and 1o 1834 are related to the k parameter. FIG. 19 is a shortened representation 1900 of a generalized to (0, k) TMTR codes with constraint j.

Using this FSTD, the capacities of TMTR constraint for selected values of j and k are shown in Table 3 below.

TABLE 3

| k | j=1 | j=2 | j=3 | j=4 | j=5 | j=6 | j = ∞, $C_k$ |
|---|---|---|---|---|---|---|---|
| 1 | 0.0000 | 0.5000 | 0.5840 | 0.6358 | 0.6600 | 0.6743 | 0.6942 |
| 2 | 0.5706 | 0.7507 | 0.8170 | 0.8482 | 0.8630 | 0.8707 | 0.8791 |
| 3 | 0.6804 | 0.8423 | 0.8974 | 0.9231 | 0.9349 | 0.9408 | 0.9468 |
| 4 | 0.7381 | 0.8802 | 0.9312 | 0.9543 | 0.9649 | 0.9701 | 0.9752 |
| 5 | 0.7619 | 0.8983 | 0.9466 | 0.9685 | 0.9785 | 0.9834 | 0.9881 |
| 6 | 0.7764 | 0.9070 | 0.9540 | 0.9753 | 0.9850 | 0.9897 | 0.9942 |
| 7 | 0.7831 | 0.9115 | 0.9576 | 0.9786 | 0.9881 | 0.9927 | 0.9971 |
| 8 | 0.7874 | 0.9137 | 0.9594 | 0.9802 | 0.9896 | 0.9942 | 0.9986 |
| 9 | 0.7894 | 0.9149 | 0.9604 | 0.9810 | 0.9904 | 0.9949 | 0.9993 |
| 10 | 0.7908 | 0.9156 | 0.9608 | 0.9814 | 0.9908 | 0.9953 | 0.9996 |
| 12 | 0.7919 | 0.9161 | 0.9612 | 0.9817 | 0.9911 | 0.9956 | 0.9999 |
| 14 | 0.7923 | 0.9162 | 0.9613 | 0.9818 | 0.9912 | 0.9957 | 1.0000 |
| 16 | 0.7924 | 0.9162 | 0.9613 | 0.9818 | 0.9912 | 0.9957 | 1.0000 |
| 18 | 0.7925 | 0.9162 | 0.9613 | 0.9818 | 0.9912 | 0.9957 | 1.0000 |
| 20 | 0.7925 | 0.9163 | 0.9613 | 0.9818 | 0.9912 | 0.9957 | 1.0000 |
| ∞ | 0.7925 | 0.9163 | 0.9613 | 0.9818 | 0.9912 | 0.9957 | 1.0000 |

Similar to MTR constraint, when j becomes infinity, TMTR becomes regular (0, k) RLL codes. Capacity values of TMTR are larger than the corresponding capacity values of MTR, due to the fact that j is relaxed to j+1 for odd time index for TMTR.

Figure 20:
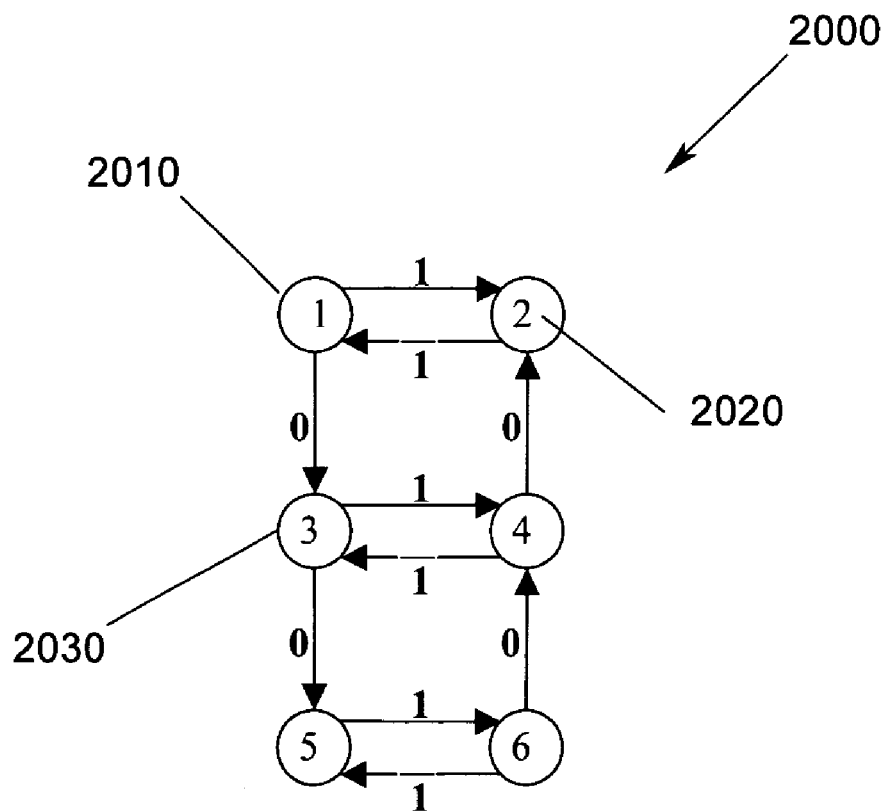
FIG. 20 is an FSTD of regular RDS code with N=4.
Figure 21:
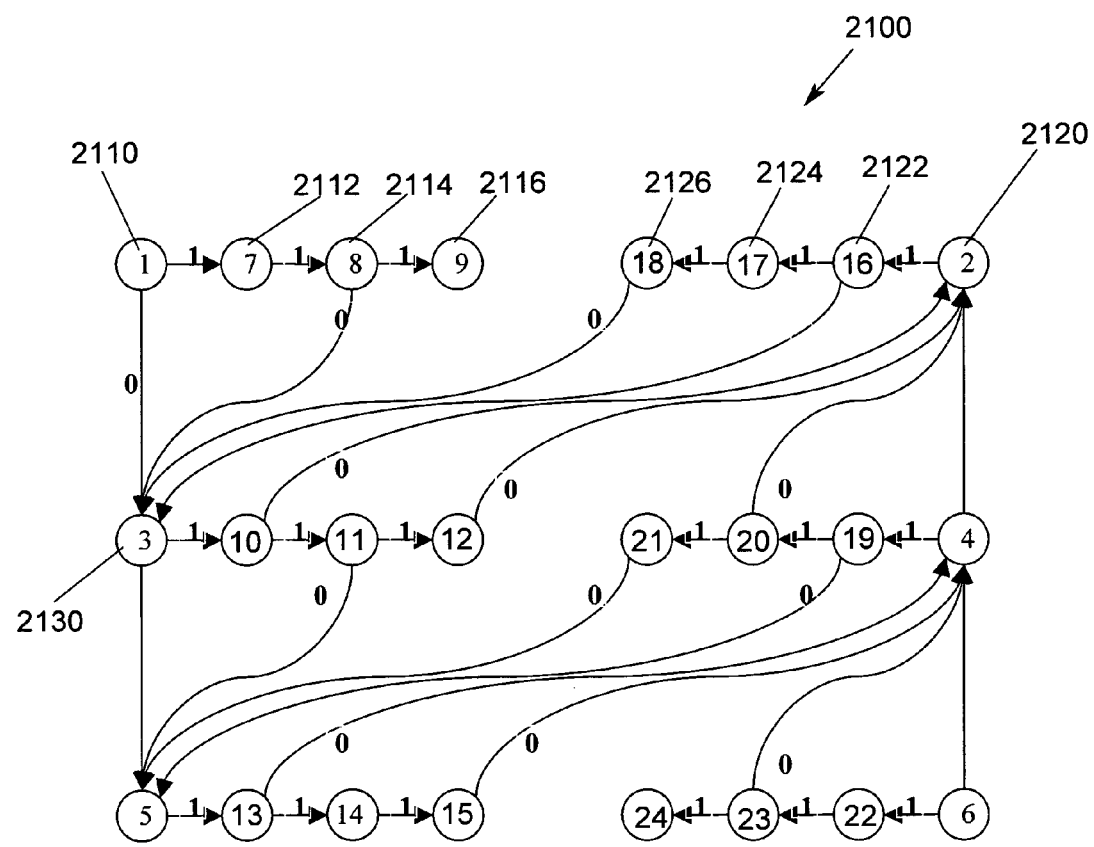
FIG. 21 is a modified FSTD of RDS code having parameters k=3 and N=4.

The properties of RDS and MTR constraints can be combined into one constraint, call the RDS-MTR constraint. The FSTD of RDS and MTR in terms of NRZI may be integrated into an RDS-MTR constraint according to an embodiment of the present invention. The FSTD of RDS contains close loops that have 1 as labels. However, MTR constraint limits the runs of consecutive 1's. Therefore, the closed loops have to be modified to obtain the MTR property. As an illustration, the FSTD of regular RDS code with N=4 2000 is shown in FIG. 20, while the modified FSTD of RDS code having parameters k=3 and N=4 2100 is shown in FIG. 21.

Now consider the paths from state 2 2020 to state 3 2030 via 1 2010 in RDS FSTD 2000. If a j=3 constraint is imposed, there are only two possibilities 10 or 1110. Referring to FIG. 21, the possibilities from state 2 2120 to state 3 2130 are clearly 10 or 1110, wherein these paths may be implemented via adding states 16 2122, 17 2124 and 18 2126. They are directly connected to state 3 2130 bypassing state 1 2110. Similarly, there are only two paths from state 1 2110 to state 3 2130, i.e., 0 and 110. States 7 2112, 8 2114 and 9 2116 are added to achieve this. This ensures that there will be at most 3 consecutive 1's and eliminates the first closed loop. Note that, states 1 2110, 7 2112, 8 2114, and 9 2116 do not contribute to capacity value because there is no way to reach them from other states of graph. Thus, they too may be eliminated.

Likewise, the possible paths under j=3 from state 3 2130 to state 5 2150 are 110 and 0. States 10 2132 and 11 2134 are used to implement this part. Meanwhile, the necessary path labels from state 3 to state 2, namely 10 and 1110 are implemented via states 10 2132, 11 2134, 12 2136. Note that states 10 2132 and 11 2134 are used in both path implementations in order to reduce the number of states. In fact, two more states may be used to implement paths from state 3 2130 to state 2 2120 and state 5 2150 separately. However this does not increase the capacity of the FSTD 2100. In this way, the rest of the graph may be determined.

Figure 22:
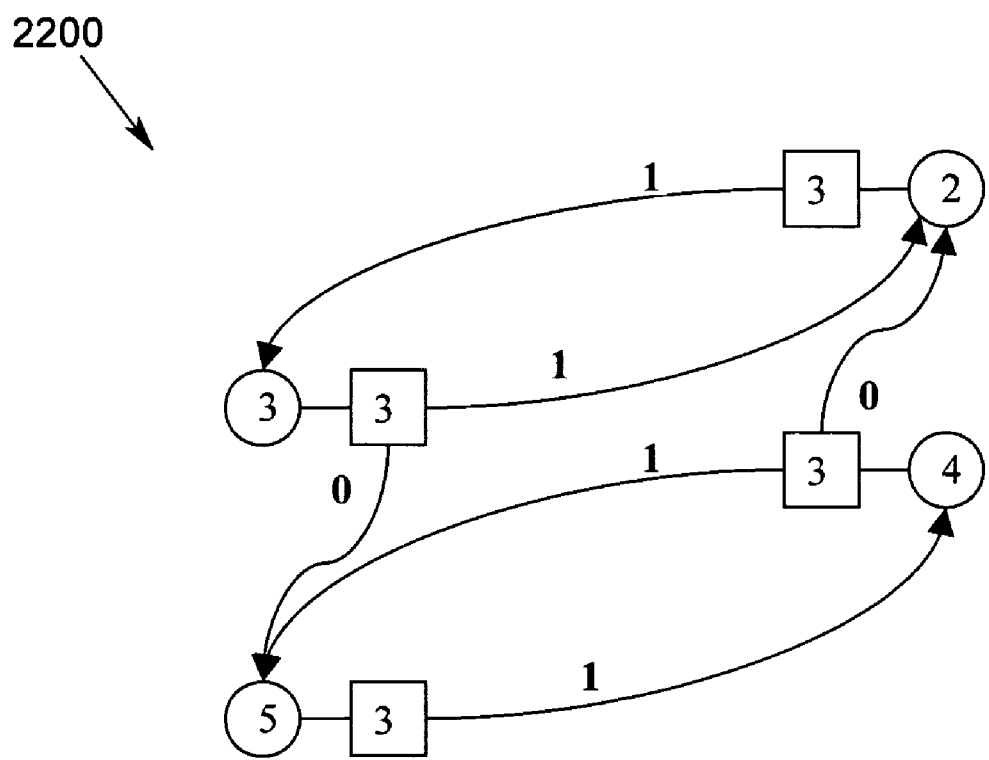
FIG. 22 shows a shortened representation of FSTD of modified RDS code with k=3 and N=4.

Clearly, this representation may be shortened. FIG. 22 is a shortened representation of FSTD of modified RDS code with k=3 and N=4 2200.

One crucial property of FIG. 22 is that the k constraint may not be embedded independent of RDS. For FIG. 22, N=k+2=4. In fact, this result is inevitable because both RDS and k constraints are controlling the runs of 0's. Therefore, from now on RDS-MTR will be described with j and N.

Figure 23:
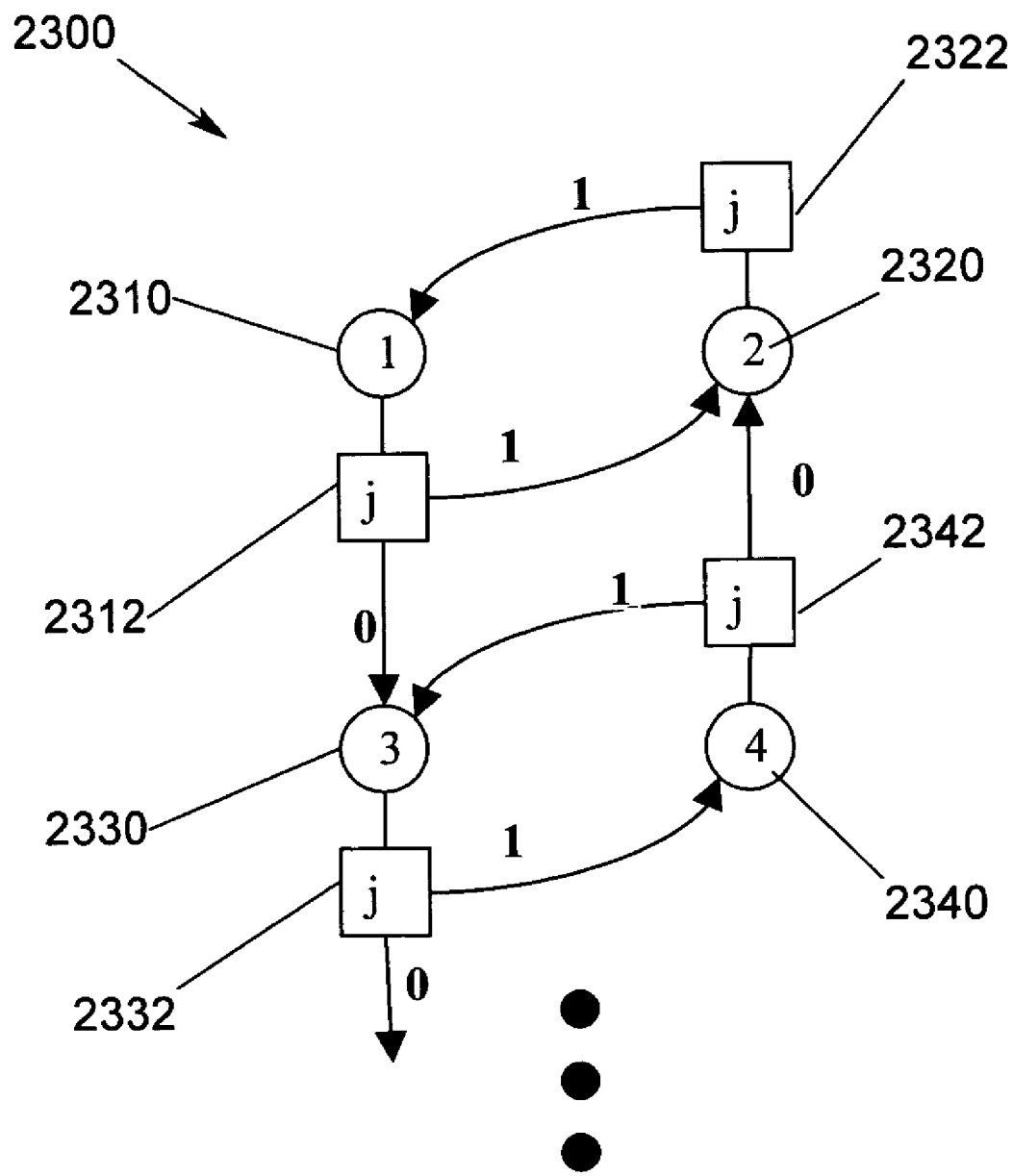
FIG. 23 is the FSTD of (0, k) RDS-MTR codes with constraints j and N according to an embodiment of the present invention.

In general the preceding construction may be used to obtain any RDS-MTR constraint. FIG. 23 is the FSTD of (0, k) RDS-MTR codes with constraints j and N 2300 according to an embodiment of the present invention. There will be 2(N−2) starting and merging states, e.g., states 1 2310, 2 2320, 3 2330, 4 2340, shown in this graph together with 2(N−2)*j intermediate states 2312, 2322, 2332, 2342. The capacities of the RDS-MTR constraint for selected values of j and N are shown in Table 4.

TABLE 4

| | j | | | | | | |
|---|---|---|---|---|---|---|---|
| N = k + 2 | 1 | 2 | 3 | 4 | 5 | 6 | j = ∞, $C_{RDS}$ |
| 3 | 0.0000 | 0.0000 | 0.3471 | 0.3471 | 0.4396 | 0.4396 | 0.5000 |
| 4 | 0.2878 | 0.4057 | 0.5943 | 0.6174 | 0.6623 | 0.6690 | 0.6942 |
| 5 | 0.4248 | 0.5706 | 0.7115 | 0.7381 | 0.7694 | 0.7764 | 0.7925 |
| 6 | 0.5018 | 0.6594 | 0.7777 | 0.8052 | 0.8303 | 0.8372 | 0.8495 |
| 7 | 0.5497 | 0.7139 | 0.8191 | 0.8469 | 0.8687 | 0.8754 | 0.8858 |
| 8 | 0.5816 | 0.7499 | 0.8468 | 0.8748 | 0.8945 | 0.9010 | 0.9103 |
| 9 | 0.6039 | 0.7752 | 0.8664 | 0.8944 | 0.9127 | 0.9191 | 0.9276 |
| 10 | 0.6202 | 0.7936 | 0.8807 | 0.9087 | 0.9260 | 0.9324 | 0.9403 |
| 12 | 0.6419 | 0.8182 | 0.8998 | 0.9279 | 0.9439 | 0.9502 | 0.9575 |
| 14 | 0.6552 | 0.8334 | 0.9116 | 0.9398 | 0.9550 | 0.9612 | 0.9681 |
| 16 | 0.6641 | 0.8436 | 0.9195 | 0.9477 | 0.9624 | 0.9686 | 0.9752 |
| 18 | 0.6702 | 0.8507 | 0.9250 | 0.9532 | 0.9676 | 0.9737 | 0.9802 |
| 20 | 0.6746 | 0.8558 | 0.9290 | 0.9572 | 0.9713 | 0.9775 | 0.9838 |
| 24 | 0.6805 | 0.8627 | 0.9342 | 0.9625 | 0.9763 | 0.9824 | 0.9886 |
| 28 | 0.6841 | 0.8669 | 0.9375 | 0.9658 | 0.9793 | 0.9854 | 0.9915 |
| 32 | 0.6864 | 0.8697 | 0.9396 | 0.9680 | 0.9813 | 0.9874 | 0.9935 |
| 36 | 0.6880 | 0.8716 | 0.9411 | 0.9694 | 0.9827 | 0.9888 | 0.9948 |
| 40 | 0.6892 | 0.8730 | 0.9421 | 0.9705 | 0.9837 | 0.9898 | 0.9958 |
| N = ∞, $C_{MTR}$ | 0.6942 | 0.8791 | 0.9468 | 0.9752 | 0.9881 | 0.9942 | 1.0000 |

When $j \rightarrow \infty$, RDS-MTR codes become RDS codes. On the other hand when $N \rightarrow \infty$, RDS-MTR codes become MTR codes as expected. If this table is compared with previous tables of MTR and RDS codes, even though the two constraints have been combined, no significant capacity was lost.

Figure 24:
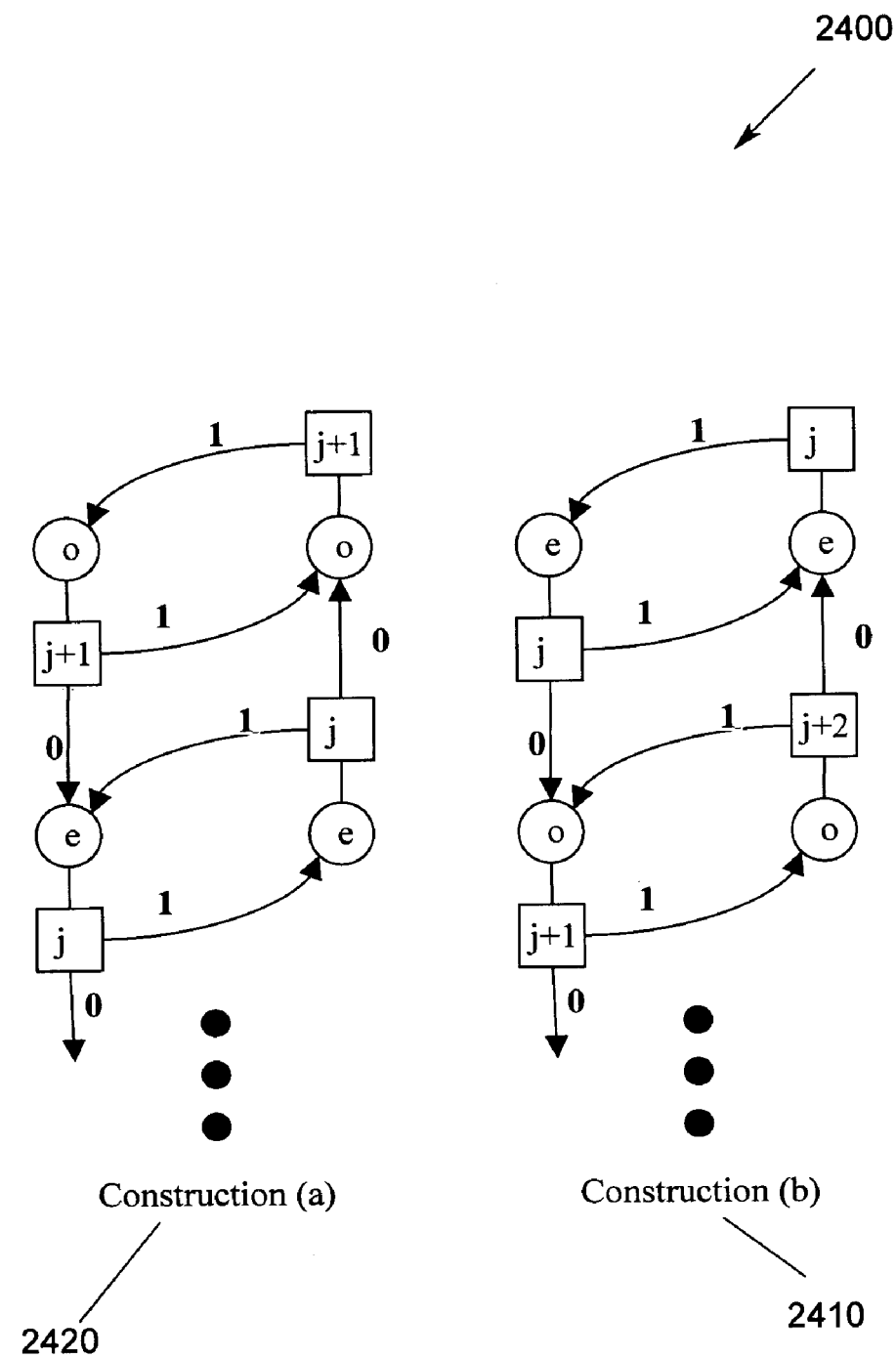
FIG. 24 shows two types FSTD with odd and even starting states respectively according to an embodiment of the present invention.
Figure 25:
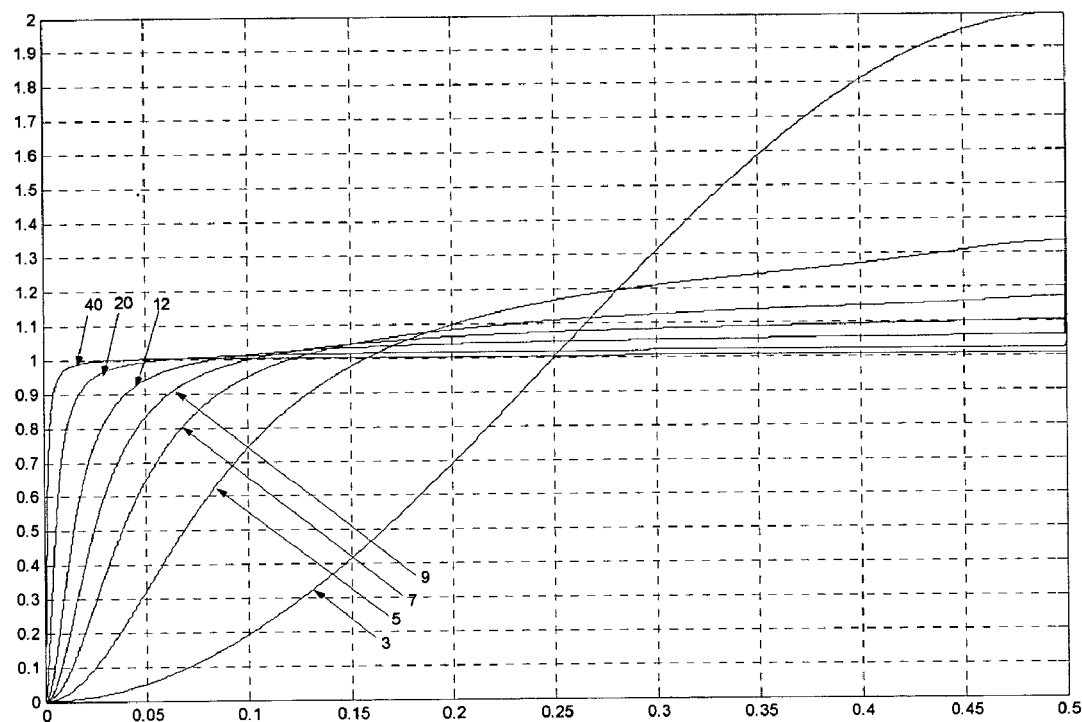
FIGS. 25–31 show the spectra of codes according to an embodiment of the present invention.
Figure 26:
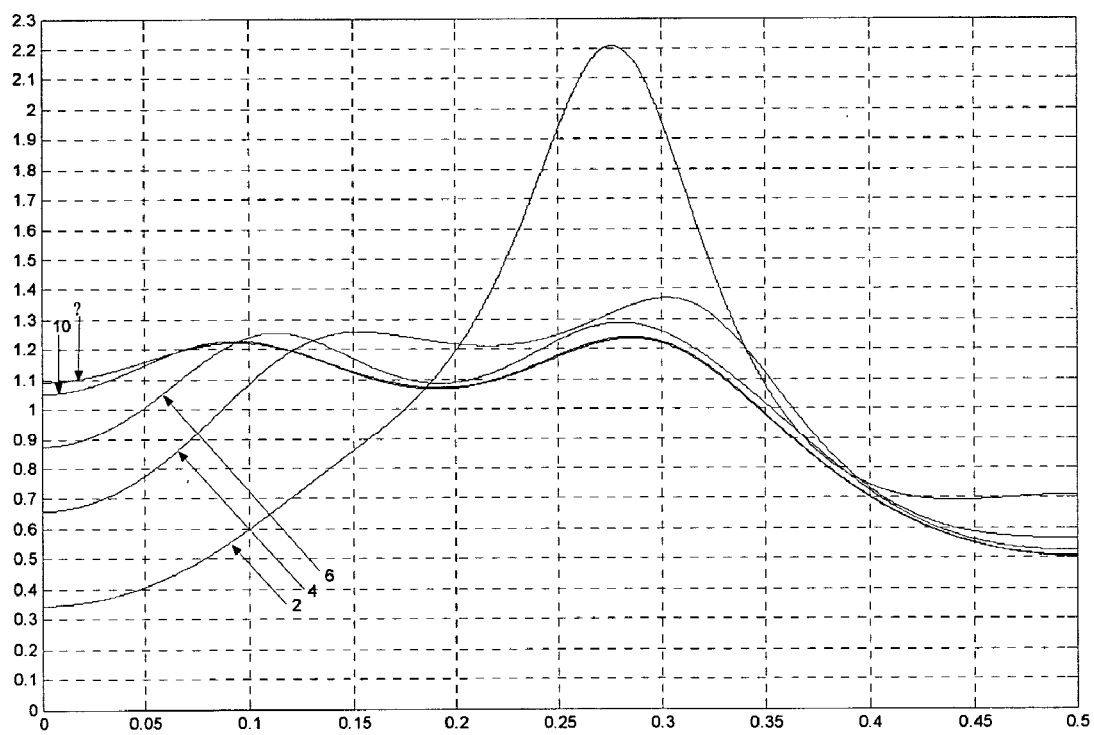
Figure 27:
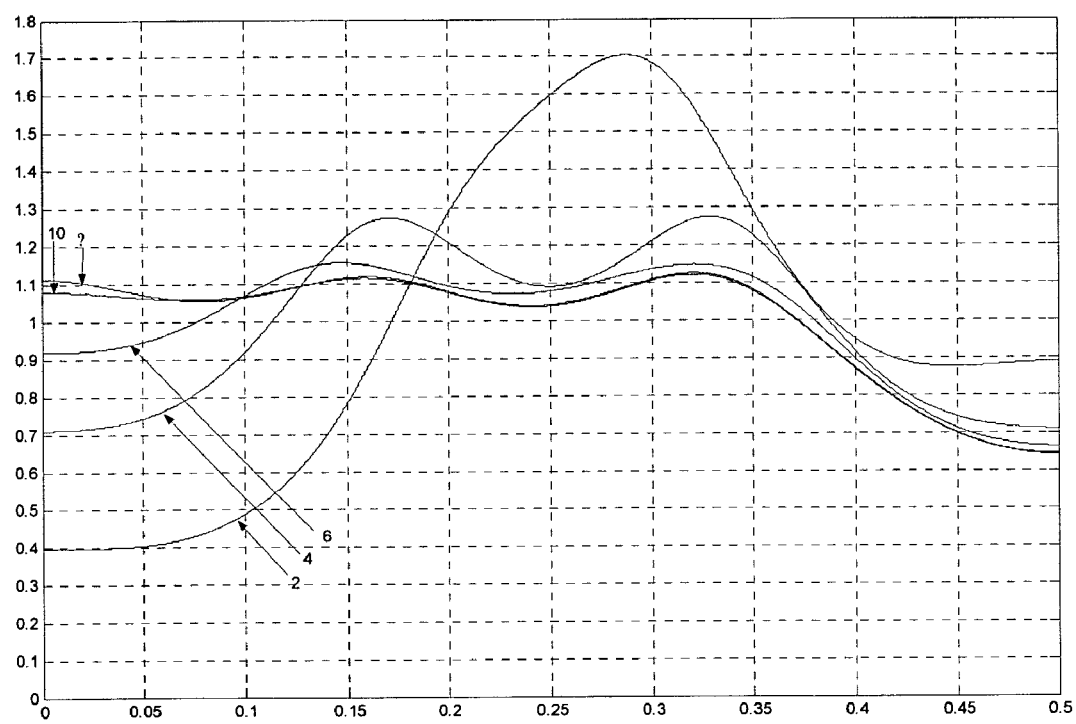
Figure 28:
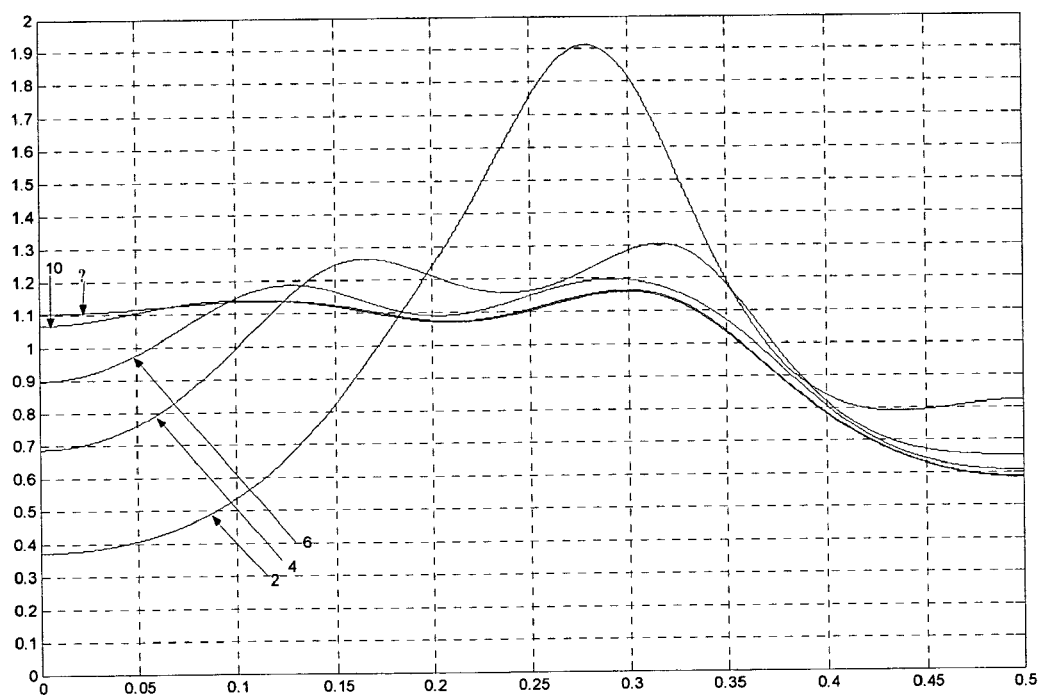
Figure 29:
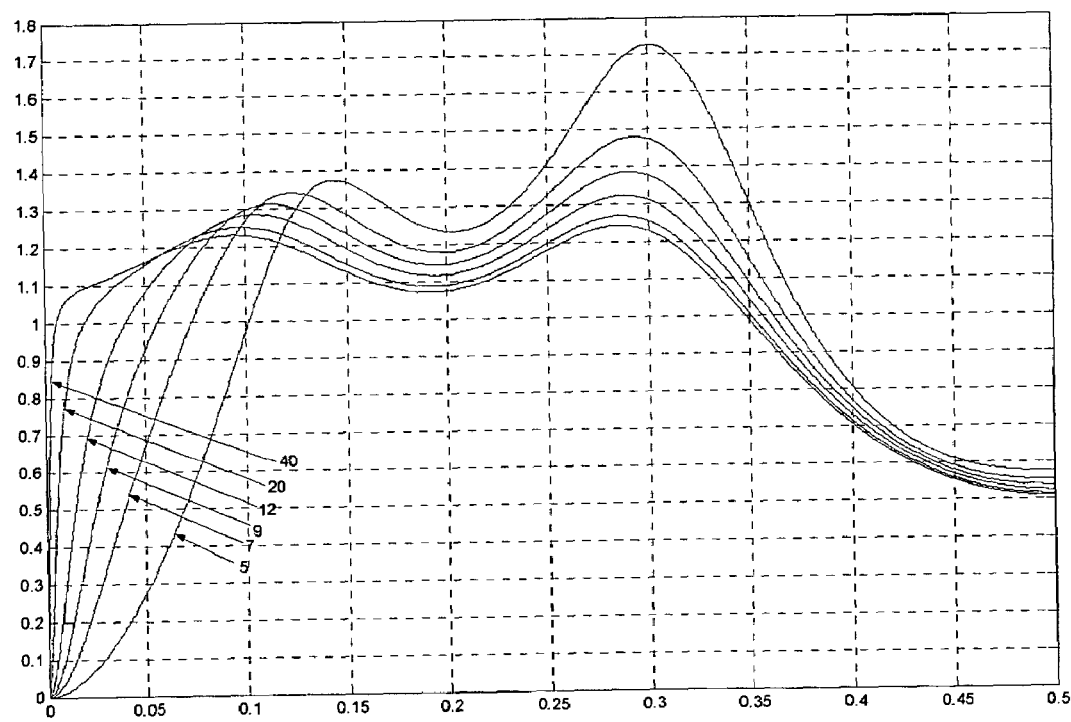
Figure 30:
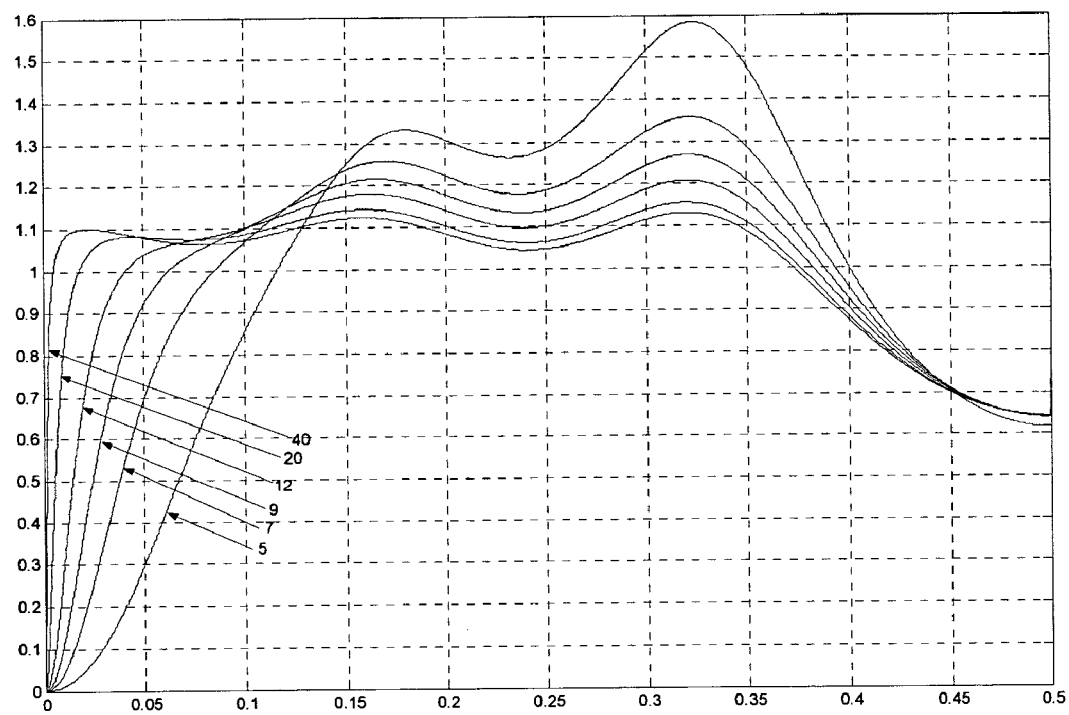
Figure 31:
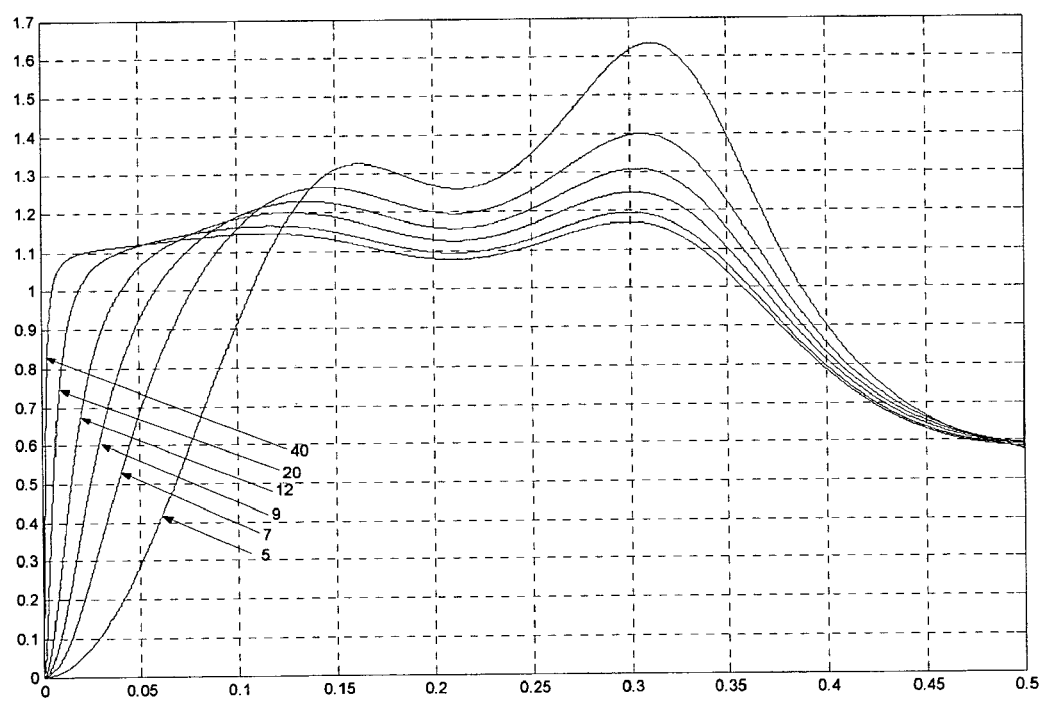

The motivation and construction of RDS-TMTR with parameters j and N is the same as RDS-MTR except that there are even and odd states among not only starting and merging states but also intermediate states. Similar to TMTR, odd states can have j+1 consecutive 1's. FIG. 24 shows a FSTD for RDS-TMTR with parameters j and N 2400 according to an embodiment of the present invention. Because the graph can start with odd 2410 or even 2420 states, two types of construction of FSTD are shown.

However, this does not make a difference when N is even due to the symmetric graph. On the contrary, when N is odd, different capacity values for the same values of j and N are obtained.

The capacities of RDS-TMTR codes with some values of j and N using construction (a) are tabulated in Table 5 below:

TABLE 5

| | Construction (a) | | | | | | |
|---|---|---|---|---|---|---|---|
| | j | | | | | | |
| N = k + 2 | 1 | 2 | 3 | 4 | 5 | 6 | j = ∞, $C_{RDS}$ |
| 3 | 0.0000 | 0.3471 | 0.3471 | 0.4396 | 0.4396 | 0.4734 | 0.5000 |
| 4 | 0.3471 | 0.5234 | 0.6060 | 0.6420 | 0.6657 | 0.6763 | 0.6942 |
| 5 | 0.5000 | 0.6709 | 0.7250 | 0.7586 | 0.7729 | 0.7820 | 0.7925 |
| 6 | 0.5840 | 0.7284 | 0.7917 | 0.8184 | 0.8338 | 0.8406 | 0.8495 |
| 7 | 0.6358 | 0.7798 | 0.8333 | 0.8595 | 0.8721 | 0.8785 | 0.8858 |
| 8 | 0.6702 | 0.8051 | 0.8611 | 0.8850 | 0.8978 | 0.9036 | 0.9103 |
| 9 | 0.6942 | 0.8293 | 0.8807 | 0.9044 | 0.9159 | 0.9216 | 0.9276 |
| 10 | 0.7118 | 0.8426 | 0.8950 | 0.9177 | 0.9292 | 0.9345 | 0.9403 |
| 12 | 0.7352 | 0.8638 | 0.9142 | 0.9362 | 0.9471 | 0.9521 | 0.9575 |
| 14 | 0.7497 | 0.8769 | 0.9260 | 0.9476 | 0.9581 | 0.9631 | 0.9681 |
| 16 | 0.7593 | 0.8857 | 0.9339 | 0.9553 | 0.9655 | 0.9703 | 0.9752 |

TABLE 5-continued

Construction (a)

| | j | | | | | | |
|---|---|---|---|---|---|---|---|
| N = k + 2 | 1 | 2 | 3 | 4 | 5 | 6 | j = ∞, $C_{RDS}$ |
| 18 | 0.7659 | 0.8918 | 0.9394 | 0.9606 | 0.9707 | 0.9754 | 0.9802 |
| 20 | 0.7708 | 0.8963 | 0.9434 | 0.9645 | 0.9744 | 0.9791 | 0.9838 |
| 24 | 0.7772 | 0.9022 | 0.9487 | 0.9696 | 0.9794 | 0.9840 | 0.9886 |
| 28 | 0.7811 | 0.9058 | 0.9520 | 0.9728 | 0.9824 | 0.9870 | 0.9915 |
| 32 | 0.7837 | 0.9082 | 0.9541 | 0.9748 | 0.9844 | 0.9890 | 0.9935 |
| 36 | 0.7855 | 0.9098 | 0.9556 | 0.9763 | 0.9858 | 0.9904 | 0.9948 |
| 40 | 0.7868 | 0.9110 | 0.9567 | 0.9773 | 0.9868 | 0.9913 | 0.9958 |
| N = ∞, $C_{TMTR}$ | 0.7925 | 0.9163 | 0.9613 | 0.9818 | 0.9912 | 0.9957 | 1.0000 |

Table 6 shows the capacities of RDS-TMTR codes with some values of j and N using construction (b).

TABLE 6

Construction (b)

| | j | | | | | | |
|---|---|---|---|---|---|---|---|
| N = k + 2 | 1 | 2 | 3 | 4 | 5 | 6 | j = ∞, $C_{RDS}$ |
| 3 | 0.0000 | 0.0000 | 0.3471 | 0.3471 | 0.4396 | 0.4396 | 0.5000 |
| 4 | 0.3471 | 0.5234 | 0.6060 | 0.6420 | 0.6657 | 0.6763 | 0.6942 |
| 5 | 0.5000 | 0.6358 | 0.7250 | 0.7507 | 0.7729 | 0.7798 | 0.7925 |
| 6 | 0.5840 | 0.7284 | 0.7917 | 0.8184 | 0.8338 | 0.8406 | 0.8495 |
| 7 | 0.6358 | 0.7684 | 0.8333 | 0.8571 | 0.8721 | 0.8780 | 0.8858 |
| 8 | 0.6702 | 0.8051 | 0.8611 | 0.8850 | 0.8978 | 0.9036 | 0.9103 |
| 9 | 0.6942 | 0.8241 | 0.8807 | 0.9034 | 0.9159 | 0.9213 | 0.9276 |
| 10 | 0.7118 | 0.8426 | 0.8950 | 0.9177 | 0.9292 | 0.9345 | 0.9403 |
| 12 | 0.7352 | 0.8638 | 0.9142 | 0.9362 | 0.9471 | 0.9521 | 0.9575 |
| 14 | 0.7497 | 0.8769 | 0.9260 | 0.9476 | 0.9581 | 0.9631 | 0.9681 |
| 16 | 0.7593 | 0.8857 | 0.9339 | 0.9553 | 0.9655 | 0.9703 | 0.9752 |
| 18 | 0.7659 | 0.8918 | 0.9394 | 0.9606 | 0.9707 | 0.9754 | 0.9802 |
| 20 | 0.7708 | 0.8963 | 0.9434 | 0.9645 | 0.9744 | 0.9791 | 0.9838 |
| 24 | 0.7772 | 0.9022 | 0.9487 | 0.9696 | 0.9794 | 0.9840 | 0.9886 |
| 28 | 0.7811 | 0.9058 | 0.9520 | 0.9728 | 0.9824 | 0.9870 | 0.9915 |
| 32 | 0.7837 | 0.9082 | 0.9541 | 0.9748 | 0.9844 | 0.9890 | 0.9935 |
| 36 | 0.7855 | 0.9098 | 0.9556 | 0.9763 | 0.9858 | 0.9904 | 0.9948 |
| 40 | 0.7868 | 0.9110 | 0.9567 | 0.9773 | 0.9868 | 0.9913 | 0.9958 |
| N = ∞, $C_{TMTR}$ | 0.7925 | 0.9163 | 0.9613 | 0.9818 | 0.9912 | 0.9957 | 1.0000 |

When $j \to \infty$, RDS-TMTR codes become RDS codes. On the other hand when $N \to \infty$, RDS-TMTR codes become TMTR codes as expected. The capacity values of RDS-TMTR are larger than the corresponding capacity values of RDS-MTR, due to the fact that j is relaxed to j+1 for odd time index for RDS-TMTR.

The power spectra of the RDS codes, RDS-MTR codes, and RDS-TMTR codes may be computed based on their respective FSTD. FIGS. 25–31 show the spectra of these codes. The cutoff frequencies of these codes are tabulated in Table 7 with respect to $2\pi$.

TABLE 7

| | RDS | | RDS-MTR J = 3 | | RDS-MTR J = 4 | | RDS-TMTR J = 3 | |
|---|---|---|---|---|---|---|---|---|
| N | F0% | C | F0% | C | F0% | C | F0% | C |
| 3 | 16.66 | 0.5000 | | | | | | |
| 5 | 6.879 | 0.7925 | 6.906 | 0.7115 | 6.687 | 0.7381 | 6.787 | 0.7250 |
| 7 | 3.832 | 0.8858 | 3.942 | 0.8191 | 3.767 | 0.8469 | 3.849 | 0.8333 |
| 9 | 2.448 | 0.9276 | 2.514 | 0.8664 | 2.419 | 0.8944 | 2.464 | 0.8807 |
| 12 | 1.447 | 0.9575 | 1.477 | 0.8998 | 1.436 | 0.9279 | 1.456 | 0.9142 |
| 20 | 5.548E-1 | 0.9886 | 5.609E-1 | 0.9290 | 5.528E-1 | 0.9572 | 5.567E-1 | 0.9434 |
| 40 | 1.456E-1 | 0.9958 | 1.463E-1 | 0.9421 | 1.455E-2 | 0.9705 | 1.459E-1 | 0.9567 |
| 60 | 6.583E-2 | 0.9981 | 6.604E-2 | 0.9447 | 6.581E-2 | 0.9731 | 6.592E-2 | 0.9592 |
| 80 | 3.736E-2 | 0.9989 | 3.746E-2 | 0.9456 | 3.736E-2 | 0.9740 | 3.741E-2 | 0.9601 |
| 100 | 2.404E-2 | 0.9993 | 2.408E-2 | 0.9460 | 2.404E-2 | 0.9744 | 2.406E-2 | 0.9606 |

Figure 32:
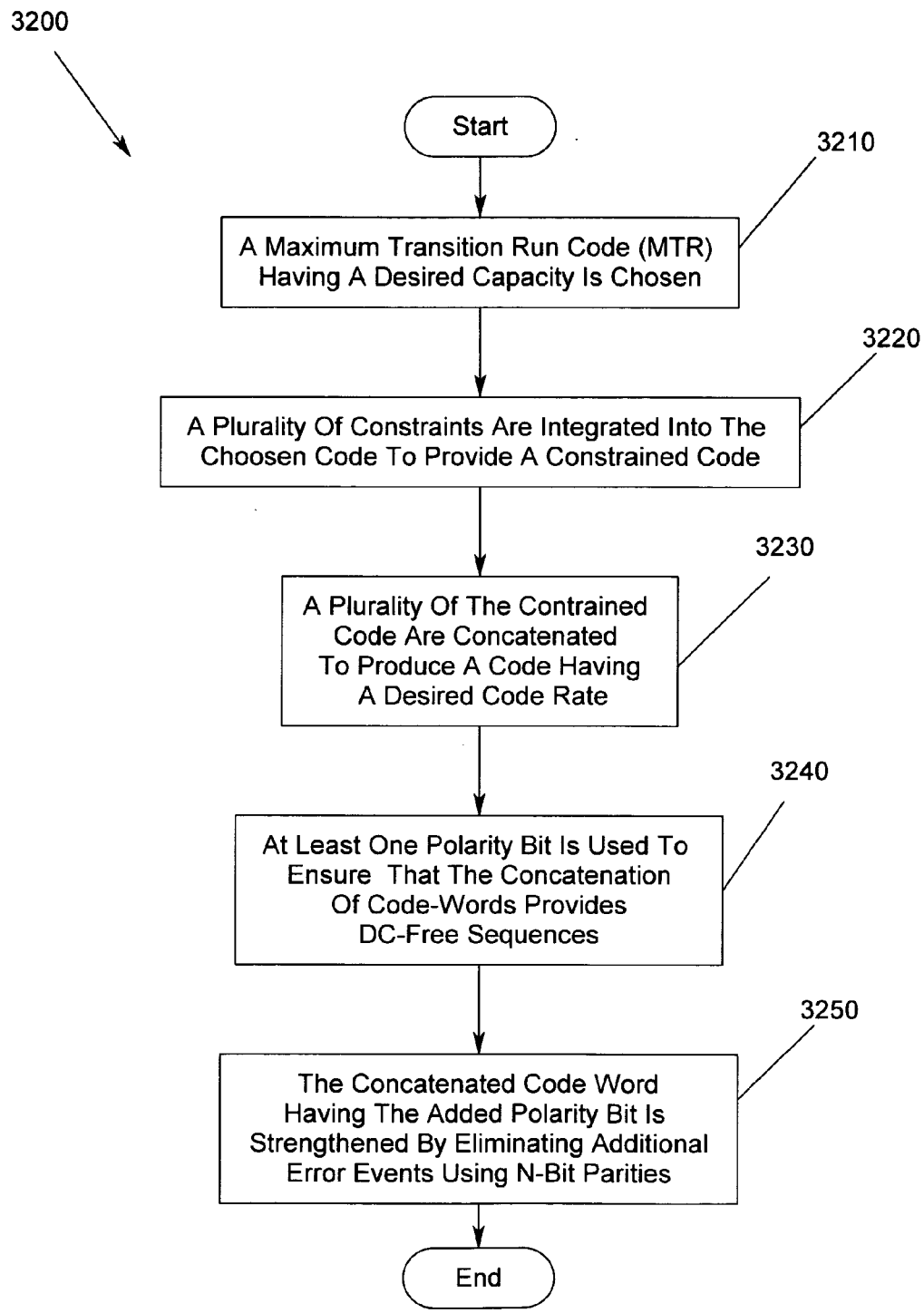
FIG. 32 shows a flow chart for implementing a code for high-density channel exhibiting low frequency content according to an embodiment of the present invention.

FIG. 32 shows a flow chart 3200 for implementing a code for high-density channel exhibiting low frequency content according to an embodiment of the present invention. First, a maximum transition run code (MTR) having a desired capacity is chosen 3210. For example, a 20/21 TMTR block code may be chosen. A plurality of constraints are integrated into the chosen code to provide a constrained code 3220. For example, TMTR, RDS, k and twin constraints may be applied. The TMTR constraint is used to limit the maximum transition run in NRZI level. The RDS constraint provides dc-free sequences when the length of the sequence is long enough. The k constraint limits the run of zeros in NRZI level. The twin constraint limits error patterns with Nyquist frequencies. A plurality of the constrained codes are concatenated to produce a code having a desired code rate 3230. For example, if a 20/21 code is chosen, a 100/105 code may be produced by concatenating five 20/21 codes. A polarity bit is used to ensure that the concatenation of codewords provides dc-free sequences 3240. For example, this may result in a 100/106 code. The concatenated codeword having the added polarity bit is strengthened by eliminating additional error events using 2-bit parities 3250.

Those skilled in the art will recognize that the above method may be used to generate any possible code constructions. At each level, the codebook integrated with a constraint may be optimized according to specific parameters of the design.

To further illustrate the method for implementing a code for high-density channel exhibiting low frequency content according to an embodiment of the present invention described above, a particular example of the design for a 100/106 TMTR code will be described.

Referring to Table 3 above, the capacity value of TMTR (jeven=3, k=∞) is 0.9613. This implies that there might be a block code that has rate more than 0.95. For the case of 10-bit codes, a target rate in the form of 10n/(10n+1), where n=1, 2, 3 . . . may be chosen. The rate 10/11 is low for practical purposes; therefore the design of a 20/21 block code will be described.

The TMTR (jeven=3) constraint has period 2 meaning that j-restriction repeats itself with 2 locations. However, this constraint has a disadvantage that makes it impractical. The proposed block code should be time varying when the codeword length is odd. The reason for this is that if a codeword starts at odd index it has to end with odd index, whereas the next codeword should start and end at even time index. Therefore, a codeword starting with four 1's cannot be the next codeword regardless of the suffix of the current codeword. Hence there have to be two distinct codebooks that are mirrors of each other. Thus, a generalized TMTR with a pattern r and period p is defined.

A pattern r is a vector with p values. Each of the p values represents the j-constraint at the corresponding location. As a special case, the pattern for TMTR (jeven=3) can be expressed as r=[3 4] or r=[4 3] depending on whether the starting index is even or odd. The r=[3 4] means that all even positions have j=3 and all odd positions have j=4.

There are two design variables associated with TMTR constraint. Obviously, the first one is the pattern r that guarantees time invariant codebook. Another design parameter is related to violation at codeword boundaries. For example, TMTR with r=[4 3 4 3 4] has the following codewords with length 5, which are shown in Table 8.

TABLE 8

The set of codewords for TMTR pattern r = [4 3 4 3 4].

| index | codeword |
|---|---|
| 1 | 00000 |
| 2 | 10000 |
| 3 | 01000 |
| 4 | 11000 |
| 5 | 00100 |
| 6 | 10100 |
| 7 | 01100 |
| 8 | 11100 |
| 9 | 00010 |
| 10 | 10010 |
| 11 | 01010 |
| 12 | 11010 |
| 13 | 00110 |
| 14 | 10110 |
| 15 | 01110 |
| 16 | 11110 |
| 17 | 00001 |
| 18 | 10001 |
| 19 | 01001 |
| 20 | 11001 |
| 21 | 00101 |
| 22 | 10101 |
| 23 | 01101 |
| 24 | 11101 |
| 25 | 00011 |
| 26 | 10011 |
| 27 | 01011 |
| 28 | 11011 |
| 29 | 00111 |
| 30 | 10111 |

From Table 8, it is clear that codeword 16 may not be appended with codeword 30. Otherwise there will be a run of seven 1's. Therefore, violations at the codeword boundaries are related to the number of consecutive 1's at the prefix or suffix of codewords. The possible suffixes and prefixes are tabulated in Table 9.

TABLE 9

The possible suffixes and prefixes at the codeword boundary.

| | 4 | 3 | 4 | 3 | 4 | 4 | 3 | 4 | 3 | 4 | |
|---|---|---|---|---|---|---|---|---|---|---|---|
| s0 | | | | 0 | 0 | | | | | | p0 |
| s1 | | | 0 | 1 | 1 | 0 | | | | | p1 |
| s2 | | 0 | 1 | 1 | 1 | 1 | 0 | | | | p2 |
| s3 | 0 | 1 | 1 | 1 | 1 | 1 | 1 | 0 | | | p3 |
| | | | | | | 1 | 1 | 1 | 1 | 0 | p4 |

Figure 33:
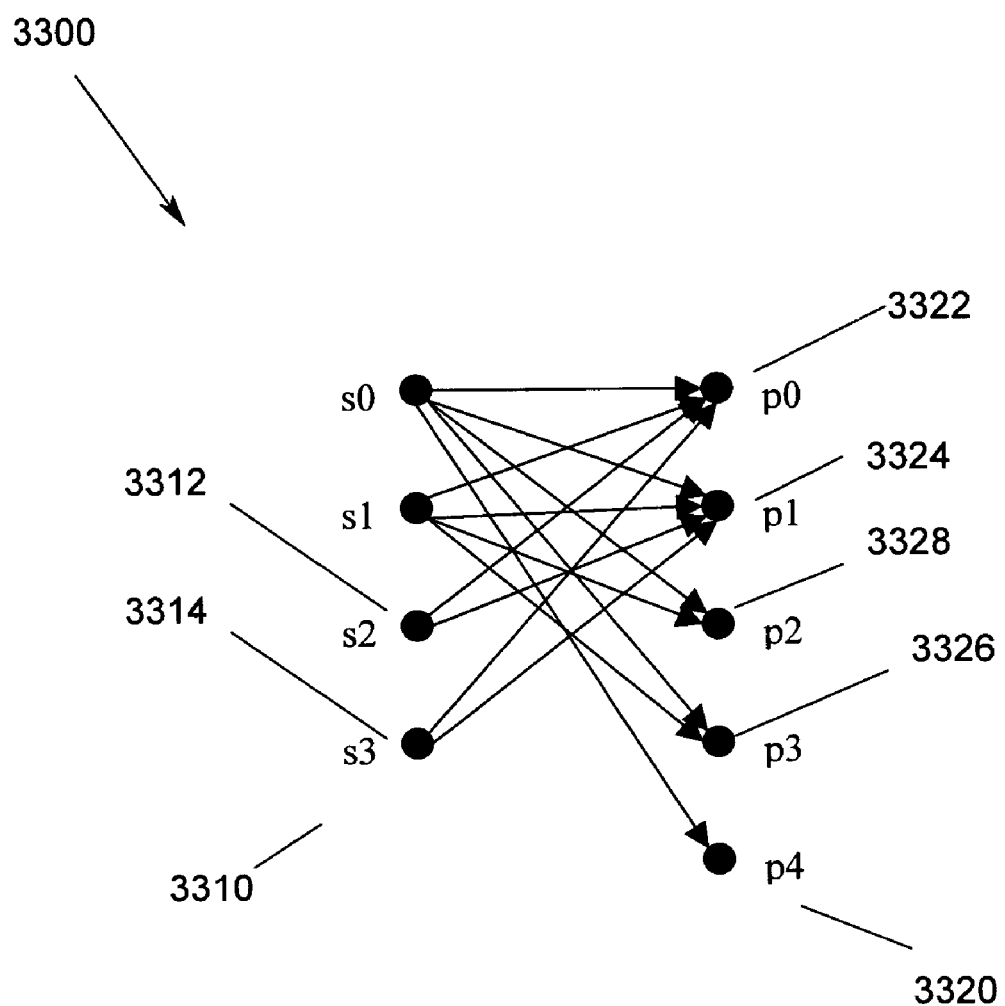
FIG. 33 is a trellis diagram showing the connection rules between suffixes and prefixes according to an embodiment of the present invention.

FIG. 33 is a trellis diagram showing the connection rules between suffixes and prefixes according to an embodiment of the present invention. In FIG. 33, the possible suffixes 3310 at codeword boundary are shown on the left and the possible prefixes 3320 at codeword boundary are shown on the right. Note that if sequences ending with suffix s2 3312 are allowed, only two choices for the prefix for the next codeword are possible, e.g., p0 3322 and p1 3324. For a block code a set of suffixes 3310 and prefixes 3320 must be chosen so that every suffix 3310 can be followed by every prefix 3320. That is, s3 3314 and p3 3326 cannot be chosen at the same time. As an illustration, {s0, s1, s2, p0, p1} will deduce a valid block code. Hence, optimization over all possibilities in this trellis must be performed to obtain the maximum number of codewords. Observe that the pattern r is also related to the possible block codes that can be constructed from the above trellis. For instance, there is no path from s2 3312 to p2 3328 because at the second to last position of the pattern only 3 consecutive 1's are allowed.

In order to design 20/21 code, the pattern r must be chosen so that codebook is not time varying. The following shows two such examples:

r1=[3 4 3 4 3 4 3 4 3 4 3 3 4 3 4 3 4 3 3 4 3];

r2=[4 3 4 3 4 3 4 3 4 3 4 3 4 3 4 3 4 3 3 4 3];

Even though the r1 may not be the optimal choice, the code designed by use of the r1 produces more codewords than that designed by use of r2. Table 10 shows the possible suffixes and prefixes for r1.

TABLE 10

The possible suffices and prefixes at the codeword boundary for pattern r1.

| | 4 | 3 | 3 | 4 | 3 | 3 | 4 | 3 | 4 | 3 | |
|---|---|---|---|---|---|---|---|---|---|---|---|
| s0 | | | | | 0 | 0 | | | | | p0 |
| s1 | | | 0 | 1 | 1 | 0 | | | | | p1 |
| s2 | | 0 | 1 | 1 | 1 | 1 | 0 | | | | p2 |
| s3 | 0 | 1 | 1 | 1 | 1 | 1 | 1 | 0 | | | p3 |

Figure 34:
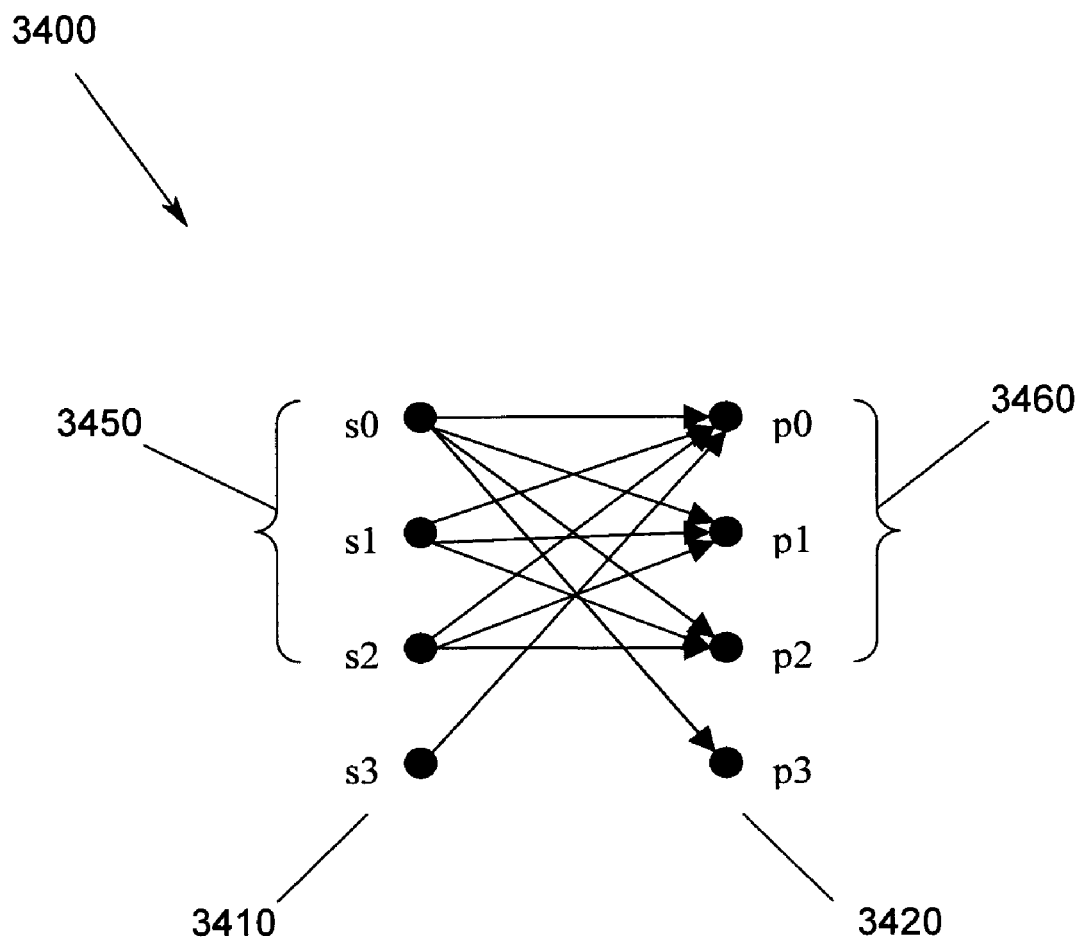
FIG. 34 shows boundary trellis for r1 according to an embodiment of the present invention.

FIG. 34 shows boundary trellis for r1 according to an embodiment of the present invention. In FIG. 34, the possible suffixes 3410 at codeword boundary are shown on the left and the possible prefixes 3420 at codeword boundary are shown on the right. In FIG. 34, {s0, s1, s2, p0, p1, p2} 3450, 3560 is the survival set of prefixes and suffixes that results in the largest number of codewords. There are 1,072,089 valid codewords that are more than the required codewords of 1,048,576. From now on, the focus will be on this particular case while embedding other constraints. Note that about 24,000 excessive codewords are available to implement the other three constraints.

Thus, a TMTR code with pattern r may be utilized to obtain block code satisfying boundary among possible sets of suffixes and prefixes. This is because that TMTR constraint is localized in the sense that only certain neighbor bits are related to each other. This is also true for k and twin constraints. However, the RDS constraint is not localized. That is, RDS information must be maintained during the encoding process from the beginning to end. Except for some low rate codes, such as zero disparity code, it is not possible to design a high rate RDS block code that guarantees dc-free sequences. Hence, the RDS information will be maintained throughout the encoding process to satisfy a desired RDS performance. Even though the blocks may be dependent to each other, the sequence may still be decoded blockwise. Hence for practical purposes the focus will remain on this case.

To discuss application of the RDS constraint, let $\{x_i\} = \{\ldots, x_{-1}, x_0, x_1, \ldots\}$, $x \in \{-1, +1\}$ be an NRZ sequence. The running digital sum RDS(i) up to time index i is defined as $$RDS(i) = \sum_{j=-\infty}^{i} x_j$$

The RDS constraint imposes an upper and lower bound on RDS(i) sequence, formally $$N_1 \leq RDS(i) \leq N_2$$

for all values of i, where $N_1$ and $N_2$ are two finite integers.

The total number of values that a sequence assumes is called digital sum variation, which denoted by N. For this case, $N = N_2 - N_1 + 1$. For the block code design here, it is crucial to monitor the change in RDS values (denoted as $\Delta$RDS) from beginning to end of codewords. Since RDS calculation is based on NRZ, codeword needs to be converted from NRZI to NRZ by assuming previous NRZ level of −1. As an example, the codeword c=[1 0 0 1 0 1 1 0 1 0 1 0 0 1 1 0 1 1 1 0 1] is transformed to NRZ level −1 [1 1 1 −1 −1 1 −1 −1 1 1 −1 −1 −1 −1 −1 1 −1 1 1 1 −1], where −1 outside the parenthesis is the previous level. This codeword has $\Delta$RDS value −3. In the case of previous level being +1, every bit in NRZ sequence will be flipped. Therefore $\Delta$RDS=+3. Hence every codeword with non-zero $\Delta$RDS can change global RDS value in both ways according to previous NRZ level that cannot be controlled. Hence, the $\Delta$RDS values will be maintained as small as possible via removing particular codewords with large $\Delta$RDS values. There are two different ways to accomplish this goal, which will be referred to as RDS I and RDS II.

For RDS I, the codewords that have $|\Delta RDS| > L$ will be removed. As an illustration, the histogram of $\Delta$RDS values of the TMTR code in previous section is tabulated in Table 11.

TABLE 11

The histogram of $\Delta$RDS values.

| $\Delta$RDS | # of code codewords |
|---|---|
| −1 | 171,813 |
| −3 | 148,387 |
| −5 | 108,634 |
| −7 | 66,869 |
| −9 | 34,159 |
| −11 | 14,196 |
| −13 | 4,658 |
| −15 | 1,152 |
| −17 | 199 |
| −19 | 21 |
| −21 | 1 |
| 1 | 169,323 |
| 3 | 142,113 |
| 5 | 101,285 |
| 7 | 60,887 |
| 9 | 30,523 |
| 11 | 12,536 |
| 13 | 4,104 |
| 15 | 1,026 |
| 17 | 182 |
| 19 | 20 |
| 21 | 1 |

Note that, the RDS values of the most of the codewords are accumulated around small $|\Delta RDS|$ values. Since there are 23,513 excessive codewords, codewords having $|\Delta RDS| > 11$ may be discarded. In this way, 1,060,725 codewords remain that satisfy $-11 \leq \Delta RDS \leq 11$. The range of global RDS value can increase or decrease by at most 11 levels. Notice that in general the global RDS value inside the codeword can vary from $\Delta$RDS by at most $\pm [n/2]$, where the n is the length of the codeword.

For RDS II, two different codebooks are used. For instance a first codebook $C_1$ may be used that contains all codewords that have $-9 \leq \Delta RDS \leq 21$, and a second codebook $C_2$ may be used that contains all the codewords that have $-21 \leq \Delta RDS \leq 9$. The total number of codewords is still bigger than $2^{20}$: $|C_1|=1,051,862$ and $|C_2|=1,054,220$. However in RDS II, encoding is different from RDS I. When the global RDS is less than 0 and the previous level of NRZ is −1, the use of $C_1$ is preferred to make the global RDS be as close to 0 as possible. However, ΔRDS may not be positive as desired, but in this way the global RDS is not worse than −9. The possible situations in encoding are shown in Table 12.

TABLE 12

The possibilities in codebook decision process.

| global RDS | previous NRZ level | codebook to use |
|---|---|---|
| ≧0 | −1 | $C_2$ |
| ≧0 | +1 | $C_1$ |
| <0 | −1 | $C_1$ |
| <0 | +1 | $C_2$ |

This encoding process depends on the global RDS value; therefore it does not generate block code. However, the encoded sequence can be designed to be block decodable. To clarify this concept, suppose that C' is the set of codewords both $C_1$ and $C_2$ contains. Note that C' will be used whether $C_1$ will be used or not. Hence, the same input words may be mapped to C'.

Figure 35:
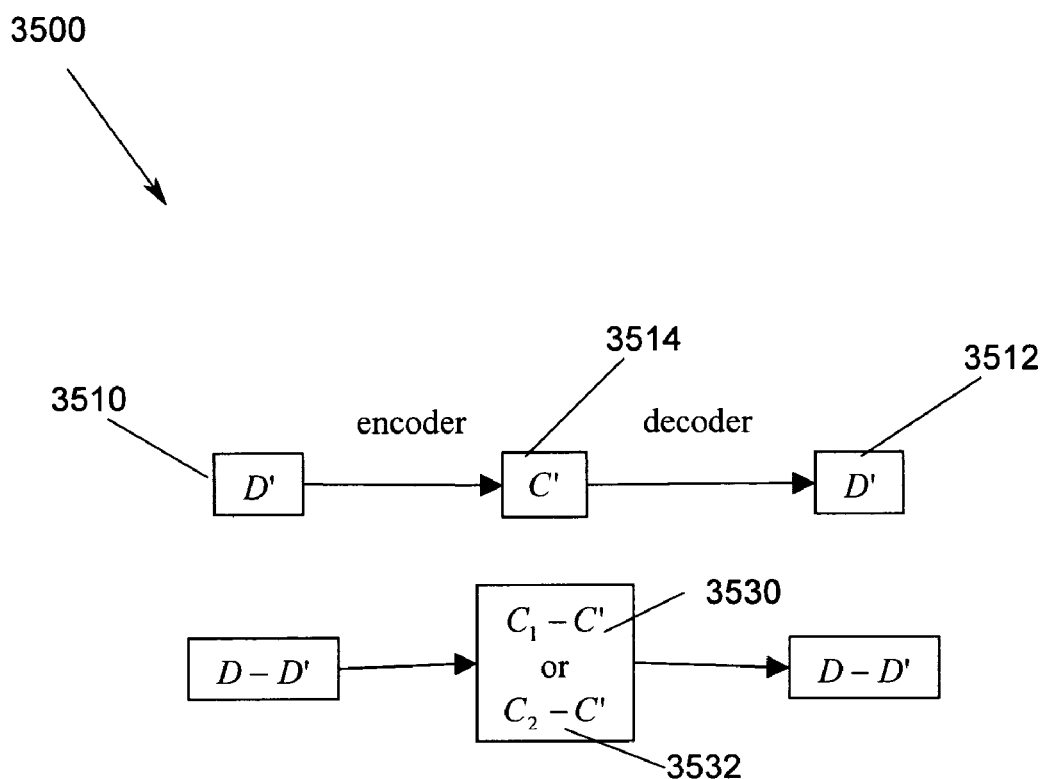
FIG. 35 illustrates encoding and decoding operations via the RDS II method according to an embodiment of the present invention.

FIG. 35 illustrates encoding and decoding operations 3500 according to an embodiment of the present invention. If D 3510 is the set of all input words, D' 3512 is the set of input words map to C' 3514. Decoding of $C_1$–C' 3530 or $C_2$–C' 3532 introduces no ambiguity because they are disjoint. As a final note, RDS II has better RDS performance than RDS I with some increases in complexity in encoding process. These two types of RDS code constructions will be revisited after imposing k and twin constraints.

The length of run of 0's is limited to k in NRZI format via the k constraint. Similar to the TMTR constraint, the k constraint is also localized. Hence it is enough to satisfy it along boundaries and inside the codeword. The TMTR code designed will be used here as a base code. Because the RDS constraint is related to the selection of codebook, it will be imposed after the implementation of the k-constraint.

Figure 36:
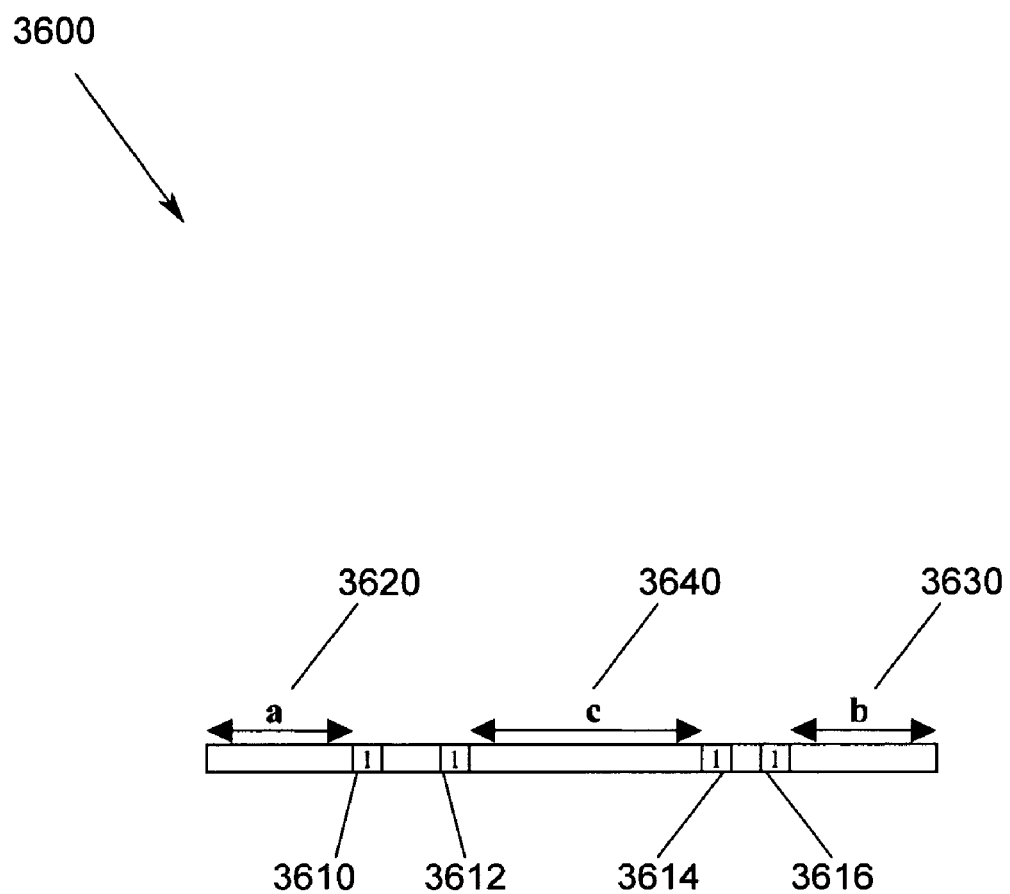
FIG. 36 illustrates the design parameters for the k constraint according to an embodiment of the present invention.

First, three parameters for each codeword are defined. FIG. 36 illustrates the design parameters for the k constraint according to an embodiment of the present invention. FIG. 36 shows a codeword 3600 having four 1's 3610–3616. The number of consecutive 0's as a prefix will be referred to as variable a 3620. The number of consecutive 0's as a suffix will be referred to as variable b 3630. The maximum length of runs of 0's inside codeword will be referred to as variable c 3640. If there is only one 1 in the codeword, then c is defined as 0. If the codeword is all zero, a=b=c=n. For k-constraint to be valid at boundary, these inequalities must satisfy $a+b \leq k$ $c \leq k$.

where a 620 and b 3630 can take values 0 to k. In order to have the largest codebook, inequalities will be set to equality. The only design choice is the selection of a 3620 or b 3630. Based on the TMTR code designed above, a 3620 is optimized to obtain the largest codebook for some values of k. The number of codewords together with RDS I and RDS II construction parameters are tabulated in Table 13.

TABLE 13

The number of codewords available after the application of k-constraint for RDS I and RDS II.

| k | # of codewords | RDS I Range | \|C\| | RDS II Range | \|$C_1$\| | \|$C_2$\| |
|---|---|---|---|---|---|---|
| 11 | 1,038,873 | — | — | — | — | — |
| 12 | 1,049,503 | [−15, 15] | 1,049,382 | [−13, 13] | 1,048,891 | 1,048,669 |
| 13 | 1,055,362 | [−13, 13] | 1,053,771 | [−11, 11] | 1,051,065 | 1,050,898 |
| 14 | 1,060,658 | [−11, 11] | 1,051,396 | [−11, 11] | 1,056,109 | 1,055,945 |
| 15 | 1,063,597 | [−11, 11] | 1,053,922 | [−11, 11] | 1,058,839 | 1,058,680 |
| 16 | 1,066,251 | [−11, 11] | 1,056,337 | [−11, 11] | 1,061,279 | 1,061,318 |
| 17 | 1,067,728 | [−11, 11] | 1,057,612 | [−9, 9] | 1,048,978 | 1,050,557 |
| 18 | 1,069,095 | [−11, 11] | 1,058,734 | [−9, 9] | 1,050,080 | 1,051,682 |
| 19 | 1,069,857 | [−11, 11] | 1,059,292 | [−9, 9] | 1,050,643 | 1,052,261 |
| 20 | 1,070,566 | [−11, 11] | 1,059,876 | [−9, 9] | 1,051,092 | 1,052,970 |
| 21 | 1,070,926 | [−11, 11] | 1,060,108 | [−9, 9] | 1,051,338 | 1,053,224 |
| 22 | 1,071,286 | [−11, 11] | 1,060,375 | [−9, 9] | 1,051,524 | 1,053,584 |
| 23 | 1,071,489 | [−11, 11] | 1,060,476 | [−9, 9] | 1,051,646 | 1,053,711 |
| 24 | 1,071,688 | [−11, 11] | 1,060,602 | [−9, 9] | 1,051,721 | 1,053,912 |
| 25 | 1,071,783 | [−11, 11] | 1,060,637 | [−9, 9] | 1,051,775 | 1,053,966 |
| 30 | 1,072,034 | [−11, 11] | 1,060,724 | [−9, 9] | 1,051,848 | 1,054,179 |
| 35 | 1,070,079 | [−11, 11] | 1,060725 | [−9, 9] | 1,051,860 | 1,054,212 |
| 40 | 1,072,088 | [−11, 11] | 1,060725 | [−9, 9] | 1,051,862 | 1,054,219 |
| 42, ∞ | 1,072,089 | [−11, 11] | 1,060725 | [−9, 9] | 1,051,862 | 1,054,220 |

For k>11, enough codewords are available to encode a 20-bit input stream. When k is small ΔRDS is high, whereas when k is high ΔRDS is relatively low. Next, integration of the twin constraint into TMTR and k constrained codebooks will be discussed.

The twin constraint prevents long lengths of error sequences with Nyquist frequencies from occurring by removing supporting sequences in the NRZI format. Error sequence of $\{+0+0 \ldots \}$ is one example. These error sequences result from the null at Nyquist frequency of channel target responses. One way to eliminate these error sequences is to limit the number of consecutive pairs of 0's or 1's (twins) in NRZI. Twin constraint is not a constraint on input sequences; rather it forbids certain input sequences according to a decoding trellis. Here it is assumed that the decoding trellis is unconstrained so that all possible t+1 pairs of zeros or ones must be eliminated to limit the maximum length of the error event to 2t. Similar to k constraint, twin constraint is also localized.

Figure 37:
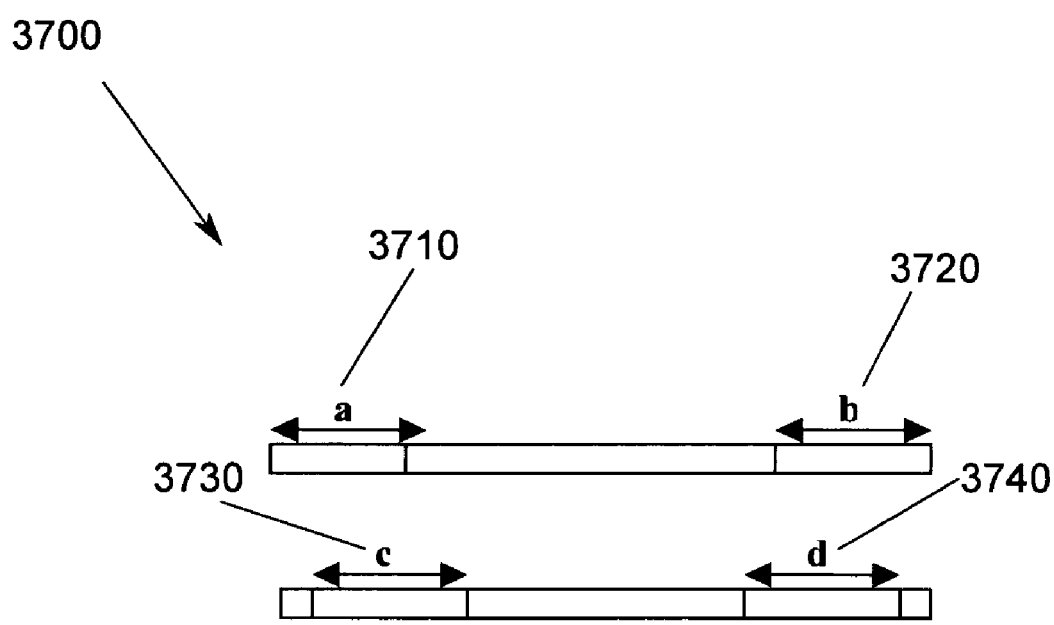
FIG. 37 illustrates the design parameters for the k constraint according to an embodiment of the present invention.

FIG. 37 illustrates the design parameters for the k constraint 3700 according to an embodiment of the present invention. For a codeword with length n, a 3710 is the number of consecutive pairs of zeros and ones as a prefix of the codeword. The number of consecutive pairs of zeros and ones as a suffix of the codeword is b 3720. The number of consecutive pairs of zeros and ones starting at $2^{nd}$ position of the codeword is c 3730. The number of consecutive pairs of zeros and ones ending at $2^{nd}$ last position of the codeword is d 3740.

Figure 38:
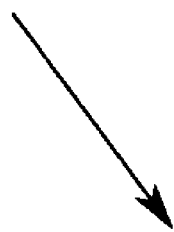
FIG. 38 illustrates the possible cases in which error patterns can propagate through codeword boundaries.
Figure 38:
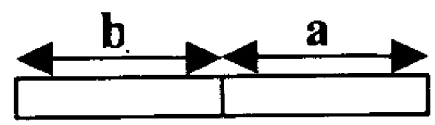
Figure 38:
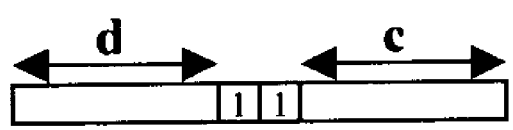
Figure 38:
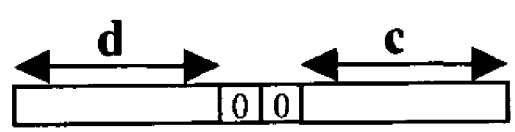

Note that a run of twins inside the codeword is not of interest because of the fact that at least the pair 11 is expected. FIG. 38 illustrates the possible codeword cases 3800 in which error patterns can propagate through codeword boundaries. At boundary, three different situations 3802, 3804, 3806 occur in which error event can propagate to the next codeword. Hence, the following relations must be ensured to be true:

$a+b \leq t$ for $0 \leq a \leq t$ $c+d \leq t-1$ for $0 \leq c \leq t-1$

Again, inequalities are set to equality in order to obtain the largest number of codewords. In this case, two parameters a 3810 and c 3820 are used to optimize for a given t. Based on combined TMTR and k constrained code discussed above, optimization is performed to find a minimum t as long as the RDS range values do not change. Table 14 shows the least values of t constraint. As can be seen, there is trade-off between k and t constraints for fixed codebook of TMTR and the same RDS performance. Typically, t=16 and k=19 to 25.

properties 100/105 code. Two different 100/105 code constructions are discussed below.

Figure 39:
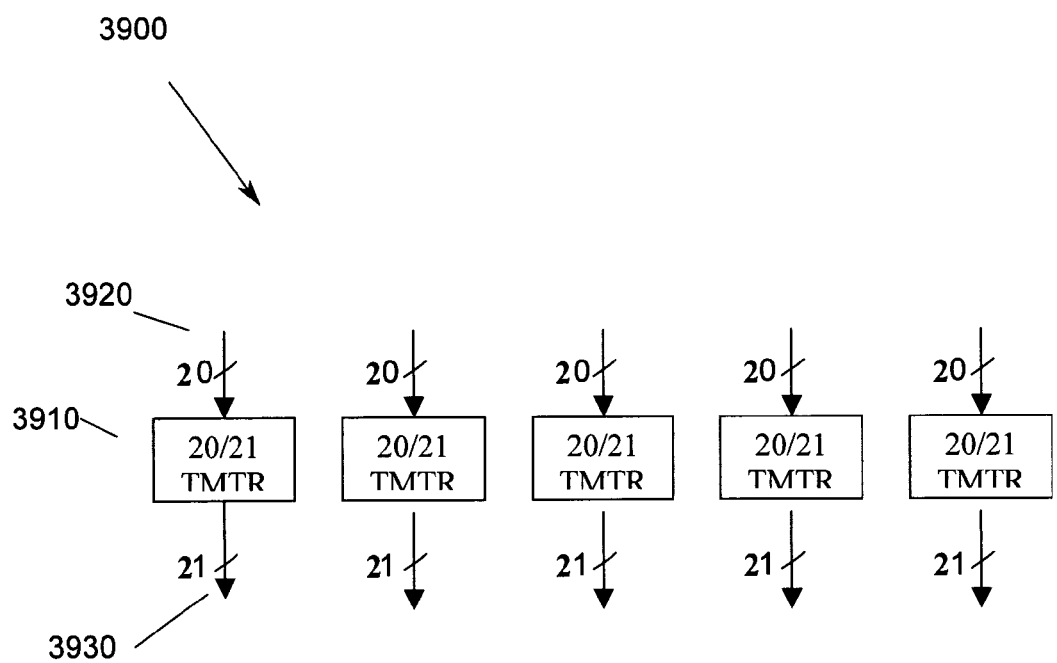
FIG. 39 is a block diagram of 100/105 code based on RDS I method.

A first construction is a 20/21 code with RDS I constraint. This is a purely block code. FIG. 39 is a block diagram 3900 of 100/105 codes based on RDS I method. In FIG. 39, five 20/21 codes 3910 are used to map five 20 bit input words 3920 to five 21 bit output words 3930. The range of ΔRDS values of 100/105 codes becomes 5×[−11, +11]=[−55, +55]. The global RDS value can fluctuate at most +10 inside the 20/21 block codeword. The true range of ΔRDS is [−65, +65].

Figure 40:
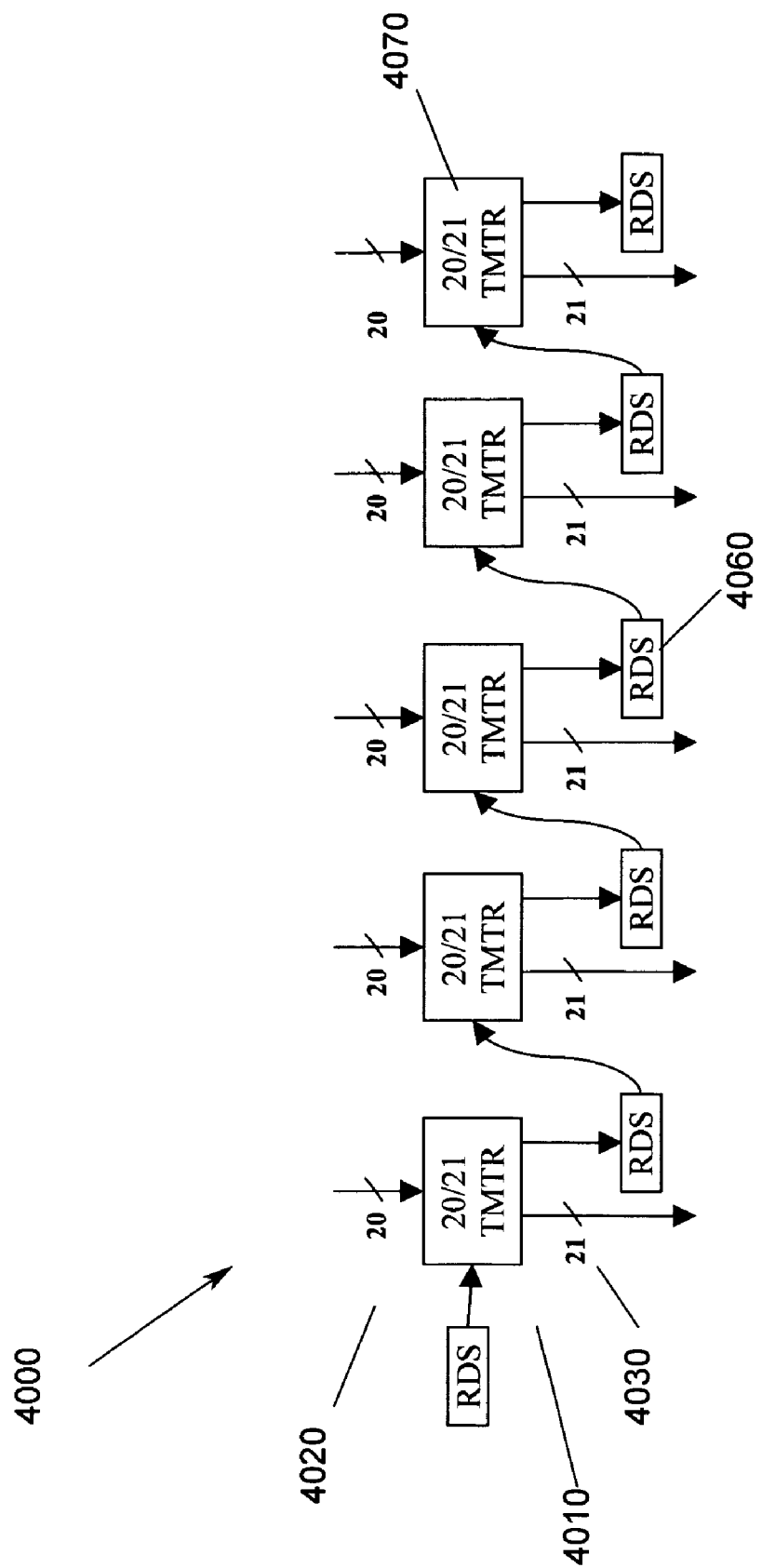
FIG. 40 is a block diagram of a 100/105 code based on RDS II method.

FIG. 40 is a block diagram 4000 of a 100/105 code based on RDS II method. In FIG. 40, five 20/21 codes 4010 are also used to map five 20 bit input words 4020 to five 21 bit output words 4030. However, in FIG. 40, at each step the global RDS value is updated by using previous NRZ levels and ΔRDS value 4060 of the encoded codeword. The new RDS value 4060 is inputted to next 20/21 block. Note that the fifth block 4070 has to wait for four previous blocks to be encoded. Hence, this introduces some latency in encoding process. However, in the block diagram 3900 shown in FIG. 39, all blocks may be encoded at the same time. The benefit of the second construction 4000 shown in FIG. 40 is better RDS performance. The range of ΔRDS values is 5×[−9, +9]=[−45, +45]. By adding RDS fluctuation inside the codeword, the true range of ΔRDS for the second construction 4000 shown in FIG. 40 is [−55, +55]. Decoding of both 100/105 codes is blockwise with length 21, since RDS does not alter block decodable property of 20/21 TMTR code.

Figure 41:
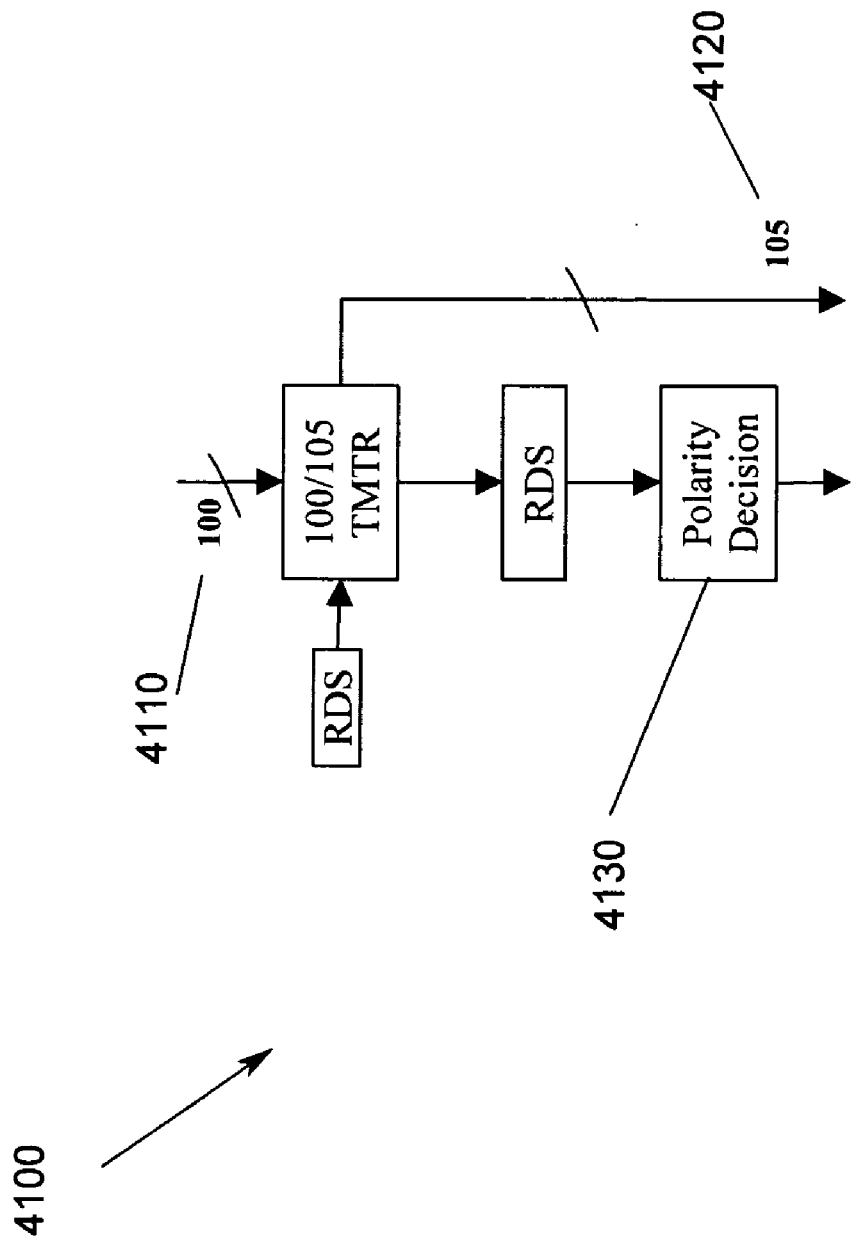
FIG. 41 illustrates a block diagram of a 100/106 code based on 100/105 code for achieving dc-free properties according to an embodiment of the present invention.

RDS properties between 100/105 blocks must be addressed. RDS has to be limited to certain ranges along the entire sequence so as to obtain dc-free property. FIG. 41 illustrates a block diagram 4100 of a 100/106 code based on 100/105 codes for achieving dc-free properties according to an embodiment of the present invention. This can be done by use of a redundant polarity bit 4130. The 100 bit input word 4110 is mapped to a 105 bit output word 4120. Adding prefix 1 to any NRZI sequence causes all bits in NRZ domain to flip. However, adding prefix 0 has no effect on the sequence. Therefore, change in RDS of 100/105 ΔRDS or −ΔRDS may be made depending on the global RDS value.

As shown in Table 15, the polarity decision box implements the possible situations of global RDS, NRZ level and

TABLE 14

| | | | RDS I | | RDS II | |
|---|---|---|---|---|---|---|
| k | t | # of codewords | Range | \|C\| | Range | \|C$_1$\| | \|C$_2$\| |
| 17 | 19 | 1,067,030 | [−11, 11] | 1,057,474 | [−9, 9] | 1,048,817 | 1,050,003 |
| 18 | 17 | 1,067,026 | [−11, 11] | 1,057,907 | [−9, 9] | 1,049,084 | 1,050,310 |
| 19 | 16 | 1,066,318 | [−11, 11] | 1,057,505 | [−9, 9] | 1,048,737 | 1,049,856 |
| 20 | 16 | 1,067,002 | [−11, 11] | 1,058,086 | [−9, 9] | 1,049,186 | 1,050,540 |
| 21 | 16 | 1,067,337 | [−11, 11] | 1,058,316 | [−9, 9] | 1,049,420 | 1,050,781 |
| 22 | 16 | 1,067,686 | [−11, 11] | 1,058,583 | [−9, 9] | 1,049,606 | 1,051,130 |
| 23 | 16 | 1,067,866 | [−11, 11] | 1,058,686 | [−9, 9] | 1,049,719 | 1,051,245 |
| 24 | 16 | 1,068,046 | [−11, 11] | 1,058,808 | [−9, 9] | 1,049,794 | 1,051425 |
| 25 | 16 | 1,068,127 | [−11, 11] | 1,058,843 | [−9, 9] | 1,049,841 | 1,051,472 |
| 30 | 15 | 1,066,286 | [−11, 11] | 1,057,359 | [−9, 9] | 1,048,623 | 1,049,851 |
| 35 | 15 | 1,066,293 | [−11, 11] | 1,057,359 | [−9, 9] | 1,048,627 | 1,049,854 |
| 40 | 15 | 1,066,293 | [−11, 11] | 1,057,359 | [−9, 9] | 1,048627 | 1,049,854 |
| 42, ∞ | 15 | 1,066,293 | [−11, 11] | 1,057,359 | [−9, 9] | 1,048627 | 1,049,854 |

Next, five blocks of 20/21 block codewords are serially concatenated to obtain a 100/105 codeword. Because the design of TMTR, k, and twin constraints have been previously accounted for, the focus now will be on the RDS ΔRDS of 100/105 code. For example, for the first row, if global RDS has negative value, a positive value may be added to make it close to zero. Because the previous NRZ level is + and ΔRDS is negative, the net effect of this block on the global RDS is positive. Hence, transition before this codeword is not needed. Other cases are obtained similarly so that the global RDS is close to zero as much it can be.

TABLE 15

The possible situations in polarity decision.

| global RDS | previous NRZ level | ΔRDS | polarity bit |
|---|---|---|---|
| <0 | +1 | <0 | 0 |
| <0 | +1 | ≧0 | 1 |
| <0 | −1 | <0 | 1 |
| <0 | −1 | ≧0 | 0 |
| ≧0 | +1 | <0 | 1 |
| ≧0 | +1 | ≧0 | 0 |
| ≧0 | −1 | <0 | 0 |
| ≧0 | −1 | ≧0 | 1 |

Note that this method guarantees that the range of global RDS for the entire sequence is the same as the range of ΔRDS.

The foregoing description of the exemplary embodiment of the invention has been presented for the purposes of illustration and description. It is not intended to be exhaustive or to the limit the invention to the precise form disclosed. Many modifications and variation are possible in light of the above teaching. It is intended that the scope of the invention be limited not with this detailed description, but rather by the claims appended hereto.

What is claimed is:

1. A method for data coding for high density channels exhibiting low frequency content, comprising:
   combining a maximum transition run constraint including time-varying maximum transition run thereafter with a running digital sum constraint;
   choosing a combined code having a desired capacity;
   integrating a plurality of constraints into the chosen code to provide a constrained code;
   concatenating a plurality of the constrained codes to produce a code having a desired code rate;
   adding at least one polarity bit to the concatenation of codewords to provide dc-free sequences; and
   eliminating additional error events using N-bit parities with the concatenated codeword with the added polarity bit.

2. The method of claim 1, wherein the choosing a combined code having a desired capacity comprises developing finite state transition diagrams (FSTD) for the combined maximum transition run constraint and running digital sum constraint and developing capacity tables and frequency spectrum tables for the FSTDs.

3. The method of claim 1, wherein the choosing a combined code having a desired capacity comprises choosing a 20/21 TMTR block code.

4. The method of claim 1, wherein the integrating a plurality of constraints into the chosen code further comprises integrating TMTR, RDS, k and twin constraints.

5. The method of claim 4, wherein the integrating the TMTR constraint comprises limiting the maximum transition run in NRZI level.

6. The method of claim 4, wherein the integrating the RDS constraint comprises providing dc-free sequences when the length of the sequence is long enough.

7. The method of claim 4, wherein the integrating the k constraint comprises limiting the run of zeros in NRZI level.

8. The method of claim 4, wherein the integrating the twin constraint comprises limiting error patterns with Nyquist frequencies.

9. The method of claim 1, wherein the concatenating a plurality of the constrained code to produce a code having a desired code rate further comprises concatenating five 20/21 codes to provide a 100/105 code.

10. The method of claim 1, wherein the choosing the combined code comprises choosing a time-varying MTR code, wherein the consecutive state transition constraint is relaxed to allow j+1 consecutive transitions to occur when separated by at least one bit interval.

11. A data storage system, comprising:
   a translatable recording medium for storing data thereon;
   a motor for translating the recording medium;
   a transducer disposed proximate the recording medium for reading and writing data on the recording medium;
   an actuator, coupled to the transducer, for moving the transducer relative to the recording medium; and
   a read/write channel, coupled to the transducer, the read/write channel including a processor configured for processing data on the recording medium and for encoding data for high density channels exhibiting low frequency content using a code satisfying both a maximum transition run constraint and running digital sum constraint, having a desired capacity and code rate governed by the capacity.

12. The storage system of claim 11, wherein the code comprises a maximum transition run constraint including time-varying maximum transition run thereafter combined with a running digital sum constraint, wherein the maximum transition run constraint and the running digital sum constraint are selected to provide a desired capacity and a desired code rate, wherein the code further comprises at least one polarity bit for providing dc-free sequences and eliminating additional error events using N-bit parities.

13. The storage system of claim 12, wherein the chosen combined code having a desired capacity is selected using finite state transition diagrams (FSTD) developed for the combined maximum transition run constraint and running digital sum constraint and capacity tables and frequency spectrum tables for the FSTDs.

14. The storage system of claim 12, wherein the combined code comprises a 20/21 TMTR block code.

15. The storage system of claim 12, wherein the plurality of constraints comprises at least one chosen from the group consisting of TMTR, RDS, k constraints and twin constraints.

16. The storage system of claim 15, wherein the TMTR constraint limits the maximum transition run in NRZI level.

17. The storage system of claim 15, wherein the RDS constraint provides dc-free sequences when the length of the sequence is long enough.

18. The storage system of claim 15, wherein the k constraint limits the run of zeros in NRZI level.

19. The storage system of claim 15, wherein the twin constraint limits error patterns with Nyquist frequencies.

20. The storage system of claim 12, wherein the concatenated constrained code further comprises a concatenation of five 20/21 codes to provide a 100/105 code.

21. The storage system of claim 12, wherein the combined code comprises a time-varying MTR code, wherein the consecutive state transition constraint is relaxed to allow j+1 consecutive transitions to occur when separated by at least one bit interval.

22. A code embodied in a tangible computer readable medium comprising a concatenation of maximum transition run codes having a desired capacity, wherein the maximum transition run codes integrate a plurality of constraints and the concatenation of maximum transition run codes includes a polarity bit to provide dc-free sequences and uses 2-bit parities to eliminate additional error events.

23. The code of claim 22, wherein the maximum transition run code comprises a 20/21 TMTR block code.

24. The code of claim 22, wherein the plurality of constraints comprises at least one chosen from the group consisting of TMTR, RDS, k constraints and twin constraints.

25. The code of claim 24, wherein the TMTR constraint limits the maximum transition run in NRZI level.

26. The code of claim 24, wherein the RDS constraint provides dc-free sequences when the length of the sequence is long enough.

27. The code of claim 24, wherein the k constraint limits the run of zeros in NRZI level.

28. The code of claim 24, wherein the twin constraint limits error patterns with Nyquist frequencies.

29. The code of claim 22, wherein the concatenated constrained code further comprises a concatenation of five 20/21 codes to provide a 100/105 code.

30. The code of claim 22, wherein the MTR code comprises a time-varying MTR code, wherein the consecutive state transition constraint is relaxed to allow j+1 consecutive transitions to occur when separated by at least one bit interval.

* * * * *

UNITED STATES PATENT AND TRADEMARK OFFICE
CERTIFICATE OF CORRECTION

PATENT NO. : 7,164,371 B2  Page 1 of 1
APPLICATION NO. : 10/903978
DATED : January 16, 2007
INVENTOR(S) : Lee et al.

It is certified that error appears in the above-identified patent and that said Letters Patent is hereby corrected as shown below:

Col. 12, TABLE 3: "k" should read -- k\j --
Col. 13, TABLE 4: "N=k+2" should read -- N=k+2\j --
Col. 14, TABLE 5: "N=k+2" should read -- N=k+2\j --
Col. 15, TABLE 5: "N=k+2" should read -- N=k+2\j --
Col. 15, TABLE 6: "N=k+2" should read -- N=k+2\j --

Signed and Sealed this

Twenty-fourth Day of April, 2007

JON W. DUDAS
*Director of the United States Patent and Trademark Office*